(12) United States Patent
Yu et al.

(10) Patent No.: US 8,384,007 B2
(45) Date of Patent: Feb. 26, 2013

(54) NANO WIRE BASED PASSIVE PIXEL IMAGE SENSOR

(75) Inventors: Young-June Yu, Cranbury, NJ (US); Munib Wober, Topsfield, MA (US)

(73) Assignee: Zena Technologies, Inc., Cambridge, MA (US)

( * ) Notice: Subject to any disclaimer, the term of this patent is extended or adjusted under 35 U.S.C. 154(b) by 342 days.

(21) Appl. No.: 12/575,221

(22) Filed: Oct. 7, 2009

(65) Prior Publication Data

US 2011/0079704 A1    Apr. 7, 2011

(51) Int. Cl.
*H01L 31/00* (2006.01)
(52) U.S. Cl. .................. 250/214.1; 977/762
(58) Field of Classification Search ............. 250/214 R, 250/214.1; 977/762; 257/21, 440
See application file for complete search history.

(56) References Cited

U.S. PATENT DOCUMENTS

| | | | |
|---|---|---|---|
| 1,918,848 A | 4/1929 | Land |
| 4,017,332 A | 4/1977 | James |
| 4,827,335 A | 5/1989 | Saito |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 5,096,520 A | 3/1992 | Faris |
| 5,124,543 A | 6/1992 | Kawashima |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,401,968 A | 3/1995 | Cox |
| 5,449,626 A | 9/1995 | Hezel |
| 5,602,661 A | 2/1997 | Schadt |
| 5,612,780 A | 3/1997 | Rickenbach |
| 5,723,945 A | 3/1998 | Schermerhorn |
| 5,747,796 A | 5/1998 | Heard |
| 5,767,507 A | 6/1998 | Unul |

(Continued)

FOREIGN PATENT DOCUMENTS

| JP | 2002151715 | 5/2002 |
|---|---|---|
| JP | 2007201091 | 8/2007 |

(Continued)

OTHER PUBLICATIONS

Adler, Nanowire Lawns Make for Sheets of Image Sensors, NewScientist.com, Jul. 28, 2008.

(Continued)

*Primary Examiner* — Thanh Luu
(74) *Attorney, Agent, or Firm* — Pillsbury Winthrop Shaw Pittman LLP

(57) ABSTRACT

An imaging device including a plurality of photo-sensitive elements suitable for imaging small objects less than 500 nm in size. Each of the photo-sentive elements forms a passive pixel which comprises at least one nanowire structured photodetector and a switch transistor. The nanowire structured photodetector is configured to receive the photons and store the photo generated charges and behave as a waveguide. The switch transistor is formed either in the substrate or at the same body of the nanowire and is configured to allow photogenereated charges in the nanowire to accumulate when off and to drain from the nanowire when on. The pixel array is configured to allow high resolution imaging by arranging in a penny round pattern.

64 Claims, 16 Drawing Sheets

U.S. PATENT DOCUMENTS

| | | |
|---|---|---|
| 5,798,535 A | 8/1998 | Huang |
| 5,853,446 A | 12/1998 | Carre |
| 5,877,492 A | 3/1999 | Fujieda |
| 5,880,495 A | 3/1999 | Chen |
| 5,900,623 A * | 5/1999 | Tsang et al. ............... 250/208.1 |
| 5,943,463 A | 8/1999 | Unuma |
| 6,033,582 A | 3/2000 | Lee |
| 6,100,551 A | 8/2000 | Lee |
| 6,270,548 B1 | 8/2001 | Campbell |
| 6,326,649 B1 | 12/2001 | Chang |
| 6,388,243 B1 | 5/2002 | Berezin |
| 6,388,648 B1 | 5/2002 | Clifton |
| 6,542,231 B1 | 4/2003 | Garrett |
| 6,566,723 B1 | 5/2003 | Vook |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,105,428 B2 | 9/2006 | Pan et al. |
| 7,109,517 B2 | 9/2006 | Zaidi |
| 7,153,720 B2 | 12/2006 | Augusto |
| 7,163,659 B2 | 1/2007 | Stasiak |
| 7,230,286 B2 | 6/2007 | Cohen |
| 7,235,475 B2 | 6/2007 | Kamins |
| 7,241,434 B2 | 7/2007 | Anthony |
| 7,254,151 B2 | 8/2007 | Lieber |
| 7,262,400 B2 | 8/2007 | Yaung |
| 7,265,328 B2 | 9/2007 | Mouli |
| 7,306,963 B2 | 12/2007 | Linden |
| 7,307,327 B2 | 12/2007 | Bahl |
| 7,311,889 B2 | 12/2007 | Awano et al. |
| 7,330,404 B2 | 2/2008 | Peng et al. |
| 7,335,962 B2 | 2/2008 | Mouli |
| 7,336,860 B2 | 2/2008 | Cyr |
| 7,358,583 B2 | 4/2008 | Reznik |
| 7,446,025 B2 | 11/2008 | Cohen |
| 7,462,774 B2 | 12/2008 | Roscheisen |
| 7,471,428 B2 | 12/2008 | Ohara et al. |
| 7,491,269 B2 | 2/2009 | Legagneux |
| 7,598,482 B1 | 10/2009 | Verhulst |
| 7,622,367 B1 | 11/2009 | Nuzzo |
| 7,646,138 B2 | 1/2010 | Williams |
| 7,646,943 B1 | 1/2010 | Wober |
| 7,647,695 B2 | 1/2010 | MacNutt |
| 7,655,860 B2 | 2/2010 | Parsons |
| 7,704,806 B2 | 4/2010 | Chae |
| 7,713,779 B2 | 5/2010 | Firon |
| 7,732,839 B2 | 6/2010 | Sebe |
| 7,736,954 B2 | 6/2010 | Hussain |
| 7,740,824 B2 | 6/2010 | Godfried |
| 2002/0104821 A1 | 8/2002 | Bazylenko |
| 2002/0109082 A1 | 8/2002 | Nakayama |
| 2002/0172820 A1 | 11/2002 | Majumdar et al. |
| 2003/0003300 A1 | 1/2003 | Korgel et al. |
| 2003/0006363 A1 | 1/2003 | Campbell et al. |
| 2003/0089899 A1 | 5/2003 | Lieber |
| 2003/0103744 A1 | 6/2003 | Koyama |
| 2003/0132480 A1 | 7/2003 | Chau |
| 2003/0189202 A1 | 10/2003 | Li et al. |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson et al. |
| 2004/0118337 A1 | 6/2004 | Mizutani |
| 2004/0122328 A1 | 6/2004 | Wang |
| 2004/0124366 A1 | 7/2004 | Zeng |
| 2004/0155247 A1 | 8/2004 | Benthien |
| 2004/0180461 A1 | 9/2004 | Yaung |
| 2004/0213307 A1 | 10/2004 | Lieber |
| 2004/0223681 A1 | 11/2004 | Block |
| 2004/0241965 A1 | 12/2004 | Merritt |
| 2005/0082676 A1 | 4/2005 | Andry |
| 2005/0116271 A1 | 6/2005 | Kato |
| 2005/0133476 A1 | 6/2005 | Islam et al. |
| 2005/0190453 A1 | 9/2005 | Dobashi |
| 2005/0201704 A1 | 9/2005 | Ellwood |
| 2005/0218468 A1 | 10/2005 | Owen |
| 2005/0284517 A1 | 12/2005 | Shinohara |
| 2006/0113622 A1 | 6/2006 | Adkisson |
| 2006/0121371 A1 | 6/2006 | Wu |
| 2006/0146323 A1 | 7/2006 | Bratkovski et al. |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012985 A1 | 1/2007 | Stumbo |
| 2007/0023799 A1 | 2/2007 | Boettiger |
| 2007/0025504 A1 * | 2/2007 | Tumer ............................ 378/43 |
| 2007/0029545 A1 | 2/2007 | Striakhilev |
| 2007/0052050 A1 | 3/2007 | Dierickx |
| 2007/0082255 A1 | 4/2007 | Sun et al. |
| 2007/0099292 A1 | 5/2007 | Miller |
| 2007/0108371 A1 | 5/2007 | Stevens |
| 2007/0114622 A1 | 5/2007 | Adkisson |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0140638 A1 | 6/2007 | Yang |
| 2007/0145512 A1 | 6/2007 | Rhodes |
| 2007/0148599 A1 | 6/2007 | True |
| 2007/0152248 A1 * | 7/2007 | Choi et al. ................. 257/292 |
| 2007/0155025 A1 | 7/2007 | Zhang et al. |
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams et al. |
| 2007/0217754 A1 | 9/2007 | Sasaki |
| 2007/0228421 A1 * | 10/2007 | Shioya et al. ................. 257/213 |
| 2007/0238285 A1 | 10/2007 | Borden |
| 2007/0246689 A1 | 10/2007 | Ge |
| 2007/0248958 A1 | 10/2007 | Jovanovich |
| 2007/0272828 A1 | 11/2007 | Xu |
| 2007/0285378 A1 | 12/2007 | Lankhorst |
| 2007/0290193 A1 | 12/2007 | Tucker |
| 2008/0001498 A1 | 1/2008 | Muller |
| 2008/0036038 A1 | 2/2008 | Hersee et al. |
| 2008/0044984 A1 | 2/2008 | Hsieh |
| 2008/0047601 A1 | 2/2008 | Nag |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149944 A1 | 6/2008 | Samuelson |
| 2008/0169017 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi et al. |
| 2008/0246020 A1 | 10/2008 | Kawashima et al. |
| 2008/0246123 A1 | 10/2008 | Kamins |
| 2008/0248304 A1 | 10/2008 | Hanrath et al. |

| | | | |
|---|---|---|---|
| 2008/0251780 A1 | 10/2008 | Li | |
| 2008/0258747 A1 | 10/2008 | Kluth | |
| 2008/0283883 A1* | 11/2008 | Shim | 257/292 |
| 2008/0297281 A1 | 12/2008 | Ayazi | |
| 2008/0311693 A1 | 12/2008 | Maxwell | |
| 2009/0032687 A1 | 2/2009 | Lapstun | |
| 2009/0046749 A1 | 2/2009 | Mizuuchi | |
| 2009/0050204 A1* | 2/2009 | Habib | 136/261 |
| 2009/0057650 A1 | 3/2009 | Lieber | |
| 2009/0127442 A1 | 5/2009 | Lee | |
| 2009/0146198 A1 | 6/2009 | Joe | |
| 2009/0151782 A1 | 6/2009 | Ko | |
| 2009/0152664 A1 | 6/2009 | Klem | |
| 2009/0165844 A1 | 7/2009 | Dutta | |
| 2009/0173976 A1 | 7/2009 | Augusto | |
| 2009/0179289 A1 | 7/2009 | Park | |
| 2009/0188552 A1 | 7/2009 | Wang | |
| 2009/0189144 A1 | 7/2009 | Quitoriano | |
| 2009/0199597 A1 | 8/2009 | Danley | |
| 2009/0224245 A1 | 9/2009 | Umezaki | |
| 2009/0233445 A1 | 9/2009 | Lee | |
| 2009/0244514 A1 | 10/2009 | Jin | |
| 2009/0260687 A1 | 10/2009 | Park | |
| 2009/0266974 A1 | 10/2009 | Verhulst | |
| 2009/0272423 A1 | 11/2009 | Niira | |
| 2009/0289320 A1* | 11/2009 | Cohen | 257/458 |
| 2009/0305454 A1 | 12/2009 | Cohen | |
| 2010/0006817 A1* | 1/2010 | Ohlsson et al. | 257/13 |
| 2010/0019252 A1* | 1/2010 | Bratkovski et al. | 257/80 |
| 2010/0019296 A1 | 1/2010 | Cha | |
| 2010/0019355 A1 | 1/2010 | Kamins | |
| 2010/0104494 A1 | 4/2010 | Meng | |
| 2010/0116976 A1 | 5/2010 | Wober | |
| 2010/0132779 A1 | 6/2010 | Hong | |
| 2010/0133986 A1 | 6/2010 | Kim | |
| 2010/0136721 A1 | 6/2010 | Song | |
| 2010/0148221 A1 | 6/2010 | Yu | |
| 2010/0163714 A1 | 7/2010 | Wober | |
| 2010/0163941 A1 | 7/2010 | Jung | |
| 2010/0186809 A1* | 7/2010 | Samuelson et al. | 136/256 |
| 2010/0187404 A1 | 7/2010 | Klem | |
| 2010/0200065 A1 | 8/2010 | Choi | |
| 2010/0218816 A1 | 9/2010 | Guha | |
| 2010/0229939 A1 | 9/2010 | Shen | |
| 2010/0249877 A1* | 9/2010 | Naughton | 607/54 |
| 2010/0258184 A1 | 10/2010 | Laughlin | |
| 2010/0276572 A1 | 11/2010 | Iwabuchi | |
| 2010/0282314 A1 | 11/2010 | Coakley | |
| 2010/0308214 A1 | 12/2010 | Wober | |
| 2010/0320444 A1* | 12/2010 | Dutta | 257/21 |
| 2011/0036396 A1 | 2/2011 | Jayaraman | |
| 2011/0180894 A1* | 7/2011 | Samuelson et al. | 257/438 |
| 2011/0226937 A1 | 9/2011 | Yu | |
| 2011/0253982 A1* | 10/2011 | Wang et al. | 257/24 |

FOREIGN PATENT DOCUMENTS

| | | |
|---|---|---|
| WO | 8603347 | 6/1986 |
| WO | 0002379 A1 | 1/2000 |
| WO | 2005064337 | 7/2005 |
| WO | 2005252210 | 9/2005 |
| WO | 2008069565 | 6/2008 |
| WO | 2008079076 A1 | 7/2008 |
| WO | 2008131313 | 10/2008 |
| WO | 2008143727 A2 | 11/2008 |
| WO | 2009116018 | 9/2009 |
| WO | 2009137241 | 11/2009 |
| WO | 2010019887 | 2/2010 |
| WO | 2010039631 | 4/2010 |

OTHER PUBLICATIONS

Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Song et al., Vertically Standing Ge Nanowires on GaAs(110) Substrates, Nanotechnology 19, Feb. 21, 2008.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Madou, Properties and Growth of Silicon, Including Crystalline Silicon, Fundamentals of Microfabrication, 2nd Ed., CRC Press, 2002, pp. 125-204.
Holmes et al., Control of Thickness and Orientation of Solution-Grown Silicon Nanowires, Science, Feb. 25, 2000, vol. 287, No. 5457, pp. 1471-1473.
Morales et al., A Laser Ablation Method for the Synthesis of Crystalline Semiconductor Nanowires, Science, Jan. 9, 1998, vol. 279, pp. 208-211.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Wagner et al., Vapor-Liquid-Solid Mechanism of Single Crystal Growth, Applied Physics Letters, Mar. 1, 1964, vol. 4, No. 5, pp. 89-90.
Law et al., Semiconductor Nanowires and Nanotubes, Annu. Rev. Mater. Res., 2004, vol. 34, pp. 83-122.
Hochbaum et al., Controlled Growth of Si Nanowire Arrays for Device Integration, Nano Letters, Mar. 2005, vol. 5, No. 3, pp. 457-460.
Ge et al., Orientation-Controlled Growth of Single-Crystal Silicon-Nanowire Arrays, Advanced Materials, Jan. 18, 2005, vol. 17, No. 1, pp. 56-61.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
William Shockley and H. Queisser, Detailed Balance Limit of Efficiency of p-n. Junction Solar Cells, J. of Appl. Physics, Mar. 1961 32(3).
International Preliminary Report on Patentability for PCT International Application No. PCT/US2010/035722, mailed Nov. 3, 2011.
"CMOS image sensor pixel optical efficiency and optical crosstalk optimization using FDTD Solutions" www.lumerical.com/fdtd_microlens/cmos_image_sensor_pixel_microlens.php, Mar. 19, 2009.
Furumiya, et al. "High-sensitivity and no-crosstalk pixel technology for embedded CMOS image sensor"; IEEE Electron Device Letters, vol. 48, No. 10, Oct. 2001.
International Search Report and Written Opinion for PCT International Application No. PCT/US2010/035722, mailed Jul. 20, 2010.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Tseng, et al. 'Crosstalk improvement technology applicable to 0.14μm CMOS image sensor; IEEE International Electron Devices Meeting, Dec. 13-15, 2004; IEDM Technical Digest, pp. 997-1000. vbTab.
International Search Report and Written Opinion for PCT International Patent Application No. PCT/US2009/063592, mailed Jan. 13, 2010.
CMOS image sensor pixel microlens array optimization using Fdtd Solutions, http://www.lumerical_com/ fdtd_microlens/cmos_image_sensor pixel_microlens.php, pp. 1-2, Jun. 25, 2008.
Babinec et al., High-Flux, Low-Power Diamond Nanowire Single-Photon Source Arrays: An Enabling Material for Optical and Quantum Computing and Cryptography, obtained on Jul. 22, 2010 at URL: <http://otd.harvard.edu/technologies/tech.php?case=3702>.
Baillie et al., 'Zero-space microlenses for CMOS image sensors: optical modeling and lithographic process development', Publication Date May 2004, http://adsabs.harvard.edu/abs/2004SPIE.5377.. 953B, pp. 1-2.vbTab.
Barclay et al., Chip-Based Microcavities Coupled to NV Centers in Single Crystal Diamond, Applied Physics Letters, Nov. 12, 2009, vol. 95, Issue 19.
Brouri et al., Photon Antibunching in the Flurescence of Individual Colored Centers in Diamond, Optics Letters, Sep. 1, 2000, vol. 25, Issue 17.
Chung, Sung-Wook et al. Silicon Nanowire Devices. Applied Physics Letters, vol. 76, No. 15 (Apr. 10, 2000), pp. 2068-2070.

Deptuch et al., Vertically Integrated Circuits at Fermilab, IEEE Transactions on Nuclear Science, Aug. 2010, vol. 54, Issue 4, pp. 2178-2186.

Ekroll, On the Nature of Simultaneous Color Contrast, Dissertation, University of Kiel, 2005.

Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.

Fang et al., Fabrication of Slantingly-Aligned Silicon Nanowire Arrays for Solar Cell Applications, Nanotechnology, 2008, vol. 19, No. 25.

Gadelrab et al., The Source-Gated Amorphous Silicon Photo-Transistor, IEEE Transactions on Electron Devices, Oct. 1997, vol. 44, No. 10, pp. 1789-1794.

Gambino et al., 'CMOS Imager with Copper Wiring and Lightpipe,' Electron Devices Meeting, 2006. IEDM '06, International Publication Date: Dec. 11-13, 2006, pp. 1-4.

Garnett et al., Light Trapping in Silicon Nanowire Solar Cells, Nanoletters, Jan. 28, 2010, vol. 10, No. 3, pp. 1082-1087.

Guillaumée, et al., Polarization Sensitive Silicon Photodiodes Using Nanostructured Metallic Grids, Applied Physics Letters 94, 2009.

International Preliminary Report on Patentability for PCT International Patent Application No. PCT/U62009/055963, mailed Mar. 17, 2011.

International Search Report and Written Opinion for PCT International Application No. PCT/US2010/035726, mailed Jul. 21, 2010.

International Search Report and Written Opinion for PCT International Application No. PCT/US2010/057227, mailed Jan. 26, 2011.

International Search Report and Written Opinion for PCT International Patent Application No. PCT/US2009/055963, mailed Oct. 15, 2009.vbTab.

International Search Report and Written Opinion for PCT International Patent Application No. PCT/US2010/035727, mailed Sep. 27, 2010.

International Search Report and Written Opinion for PCT International Patent Application No. PCT/US2010/051435, mailed Dec. 3, 2010.

International Search Report and Written Opinion for PCT International Patent Application No. PCT/US2010/059468, mailed Feb. 11, 2011.

International Search Report and Written Opinion for PCT International Patent Application No. PCT/US2010/059491, mailed Feb. 9, 2011.

International Search Report and Written Opinion for PCT International Patent Application No. PCT/US2010/059501, mailed Feb. 15, 2011.

International Search Report and Written Opinion for PCT International Patent Application No. PCT/US2010/059504, mailed Apr. 7, 2011.

Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.

Junger, et. al., Polarization- and wavelength-sensitive sub-wavelength structures fabricated in the metal layers of deep submicron CMOS processes, Proc. of SPIE, vol. 7712, 2010.

Kalkofen et al., Atomic Layer Deposition of Boron Oxide as Dopant Source for Shallow Doping of Silicon, Meeting Abstract 943, 217th ECS Meeting, MA2010-01, Apr. 25-30, 2010, Vancouver Canada, El-Advanced Gate Stack, Source/Drain, and Channel Engineering for Si-Based CMOS 6: New Materials, Processes, and Equipment.

Kane, Why Nanowires Make Great Photodetectors, EurekAlert.com article, Apr. 25, 2007.

Kempa, Thomas J. et al. Single and Tandem Axial p-i-n. Nanowire Photovoltaic Devices. Nano Letters. 2008, vol. 8, No. 10, 3456-3460.

Lee et al., Vertical Pillar-Superlattice Array and Graphene Hybrid Light Emitting Diodes, Nano Letters, 2010, vol. 10, pp. 2783-2788.

Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.

Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

Loncar et al., Diamond Nanotechnology, SPIE Newsroom, May 18, 2010, obtained at url: <http://spie.org/x40194.xml?ArticleID=x40194>.

Loose et al., CMOS Detector Technology, Scientific Detector Workshop, Sicily, 2005, Experimental Astronomy, vol. 19, Issue 1-3, pp. 111-134.

Makarova et al., Fabrication of High Density, High-Aspect-Ratio Polymide Nanofilters, Journal of Vacuum Science and Technology, Nov./Dec. 2009, vol. 27, No. 6., pp. 2585-2587.

N.L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.

Nguyen et al., Deep Reactive Ion etching of Polymide for Microfluidic Applications, Journal of the Korean Physical Society, Sep. 2007, vol. 51, No. 3, pp. 984-988.

Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.

Parraga et al., Color and Luminance Information in Natural Scenes, Journal of Optical Society of America A, Optics, Image, Science and Vision, Jun. 1998, vol. 15, No. 6.

Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.

Rugani, First All-Nanowire Sensor, Technology Review, Aug. 13, 2008, Published by MIT.

Rutter, Diamond-Based Nanowire Devices Advance Quantum Science, SEAS Communications, Feb. 14, 2010, obtained at url:<http://news.haryard.edu/gazette/story/2010/02/digging-deep-into-diamonds/>.

Schmidt et al., Realization of a Silicon Nanowire Vertical Surround-Gate Field-Effect Effect Transistor, Small, Jan. 2006, vol. 2, No. 1, pp. 85-88.

Thelander et al., Nanowire-Based One-Dimensional Electronics, Materials Today, Oct. 2006, vol. 9, No. 10, pp. 28-35.

Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.

Verheijen, Marcel A. et al. Growth Kinetics of Heterostructured GaP-GaAs Nanowires. J. Am. Chem. Soc. 2006, 128, 1353-1359.

Wong et al., Lateral Nanoconcentrator Nanowire Multijunction Photovoltaic Cells, GCEP Progress report, Apr. 20, 2009, pp. 1-18.

Ye et al., Fabrication Techniques of High Aspect Ratio Vertical Lightpipes Using a Dielectric Photo Mask, SPIE, Proceedings, Feb. 2010, vol. 7591.

Zhang et al., Ultrahigh Responsivity Visible and Infrared Detection Using Silicon Nanowire Phototransistors, Nanoletters, May 14, 2010, vol. 10, No. 6, pp. 2117-2120.

International Search Report and Written Opinion for PCT International Patent Application No. PCT/US2010/051446, mailed Jan. 3, 2011.

International Search Report and Written Opinion for PCT International Patent Application No. PCT/US2011/060348, mailed Mar. 9, 2012.

International Search Report and Written Opinion for PCT International Patent Application No. PCT/US2011/064635, mailed Apr. 13, 2012.

International Search Report and Written Opinion for PCT International Patent Application No. PCT/US2011/066097, mailed Mar. 12, 2012.

International Search Report and Written Opinion for PCT International Patent Application No. PCT/US2011/067712, mailed May 3, 2012.

International Preliminary Report and Written Opinion re PCT/US2010/059491, mailed Jun. 21, 2012.

International Search Report and Written Opinion re PCT/US2011/57325, mailed Jun. 22, 2012.
International Preliminary Report and Written Opinion re PCT/US2010/059468, mailed Jun. 21, 2012.
International Preliminary Report and Written Opinion re PCT/US2010/059504, mailed Jun. 21, 2012.
International Preliminary Report and Written Opinion re PCT/US2010/059496, mailed Jun. 21, 2012.
U.S. Office Action for U.S. Appl. No. 12/573,582, dated Jun. 28, 2012.

* cited by examiner

Fig. 1, Prior Art: A cross section view of a small CMOS pixel

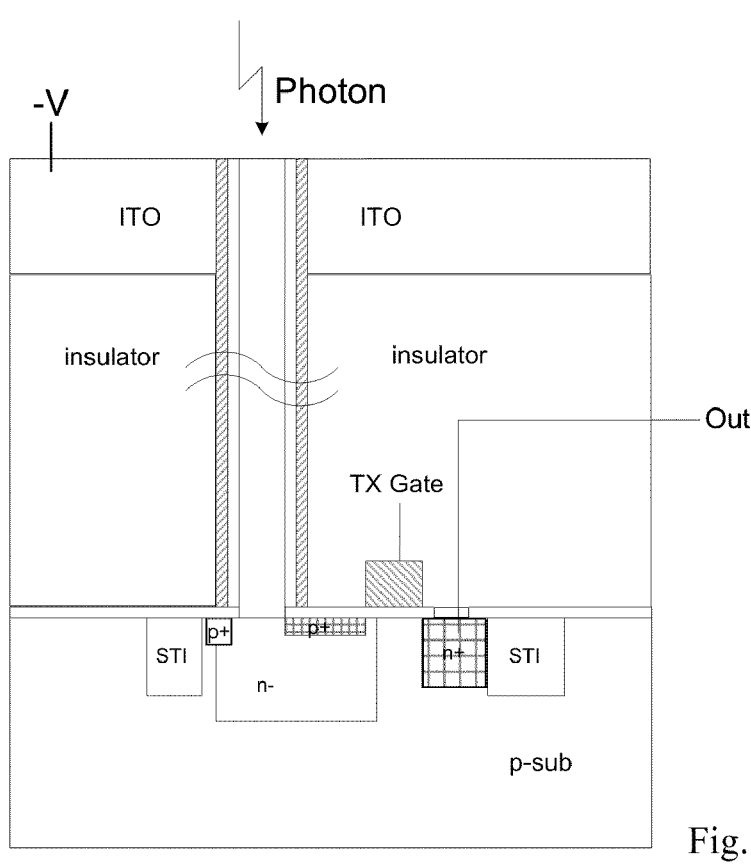
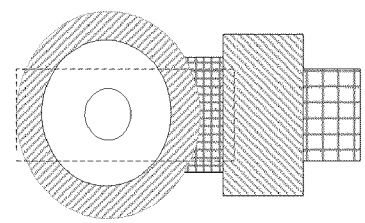
Fig. 4b Top View
Fig. 4a Cross section View

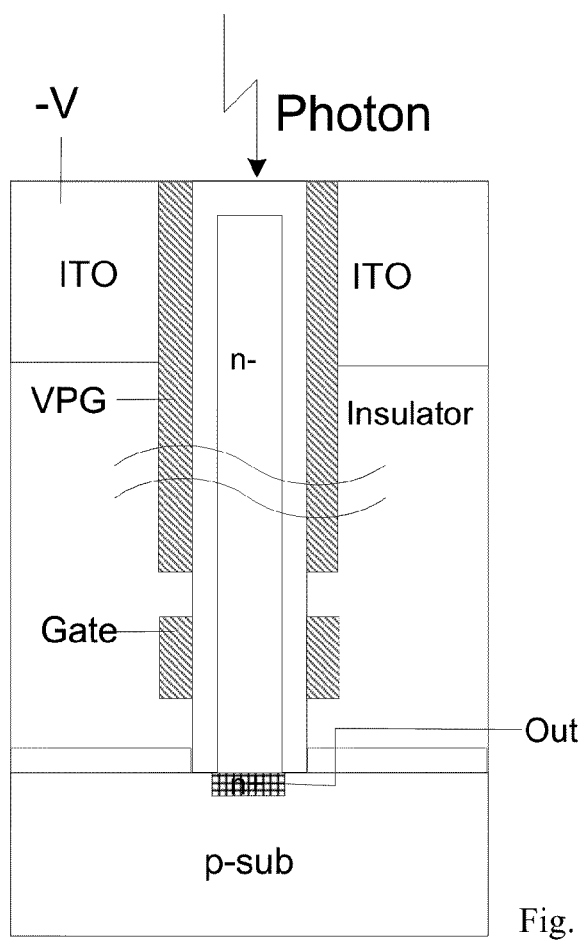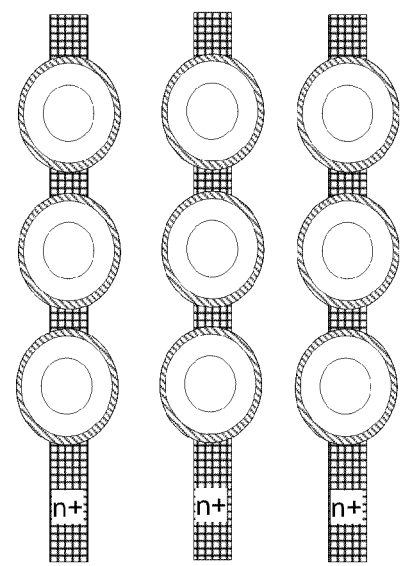
Fig. 7b  Top view of 3 x 3 pixel array
Fig. 7a  Cross section view

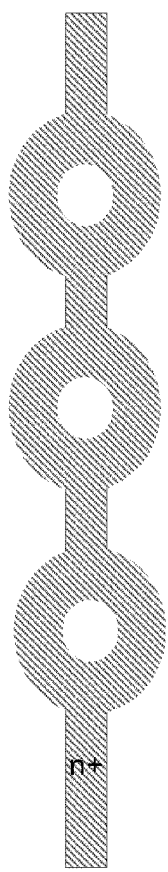
Fig. 8b  Top view of the n+ layer at the bottom

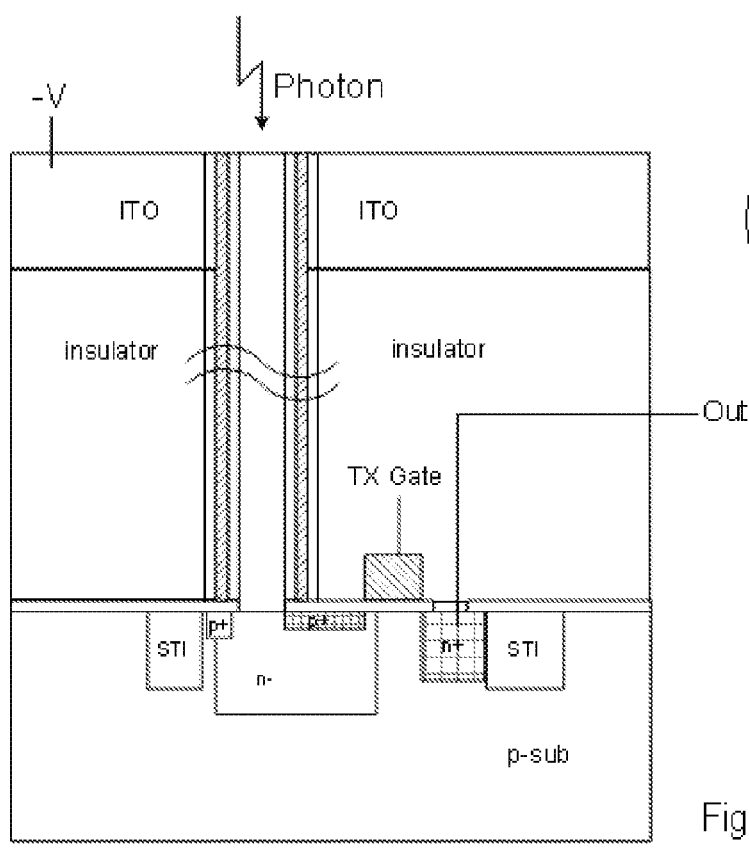
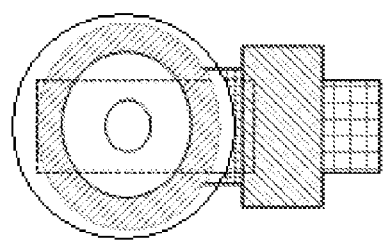
Fig. 14 b. Top View
Fig. 14a. Cross section view

NANO WIRE BASED PASSIVE PIXEL IMAGE SENSOR

FIELD OF INVENTION

The embodiments relate to nanowire devices, more particularly, to nanowire structured image sensors.

BACKGROUND

Image sensors implemented in complementary metal oxide semiconductor (CMOS) are known and widely used in many applications that were once dominated by CCD imagers. Owing to an increased demand of high resolution imagers in the market, there have been continuous efforts to scale down the pixel size of the CMOS imagers by adopting the smaller geometry process allowed by new advancements in the CMOS process. The typical CMOS active pixel sensor (APS) comprises a three transistor (3-T) pixel or a four transistor (4-T) pixel. The detecting area of the pixel is typically smaller than the physical pixel dimension due to the areas of the transistors which are readout circuit elements, not detecting elements. The percentage ratio of the photodetector area to the pixel area is referred to as the optical fill factor. A typical fill factor of a small pixel APS without using a microlens is around 30%. Despite the numerous advantages of the CMOS APS over CCD's, its performance is significantly limited by the low fill factor.

Passive pixels, however, have the advantage of having a higher fill factor because they comprises fewer non-detecting components.

Most CMOS imagers currently use microlens, which needs additional fabrication processing to enhance the fill factor by focusing the light beam on the photodetector. As pixel size shrinks beyond 2 um×2 um, however, enhancement of the fill factor by using the microlens becomes negligibly small. Consequently, the reduction in the pixel size results in reduction in the optical fill factor and low quantum efficiency (QE).

In addition to the fill factor issue, light needs to penetrate into multiple thick dielectric layers until it reaches down to the surface of the photodetector. At each interface between the layers, light is reflected due to the refractive index variations. Also light energy is lost during the transmission of these thick layers. This light transmission loss is proportional to the number of layers and thickness of the layers. The multiple dielectric layers are formed due to CMOS fabrication requirements. Typically, modern CMOS processes employ 5 to 6 metal layers for the image sensor fabrication. This leads to depositions of 5 um to 6 um thick dielectric layers because each dielectric layer plus metal layer is 1.0 um thick or so. Above the photodetector where no metal layers are present dielectric layers are filled in for the planarization of the each stack layer.

As a result, light energy loss due to transmission loss becomes significant. In addition, there is another severe problem due to the thick dielectric layers. When a pixel pitch is as small as 2.0 um or even smaller, the photodetector width would be 1 um or smaller. Then, the aspect ratio of the stack height to the size of the opening window of the metal layers above the photodetector is higher than 6. In this case, a light beam is easily blocked by the metal over-layers when the light is incident in angles other than perpendicular to the imaging plane. If a microlens is employed, the aspect ratio becomes even higher and results in a worse light shadow effect. This light shadowing becomes worsened as the pixel size becomes smaller. Consequently, the pixel signal is severely reduced, resulting in unacceptable signal to noise ratio (SNR).

Another issue that plagues image sensors is crosstalk. Crosstalk is a phenomenon by which a signal transmitted in one pixel or channel of a transmission system creates an undesired effect in another pixel or channel. For optical sensors, there are at least two types of crosstalk: (1) optical crosstalk, (2) electrical crosstalk. Optical crosstalk occurs when each pixel is not isolated optically. Since the light shielding metal layer only blocks the light that is incident from the perpendicular direction when light is incident in an angled direction or when light is reflected by the metal layers or the dielectric layer interface, scattered light in the pixel can easily travel to a neighboring pixel through the transparent dielectric layers. This effect is called a light piping effect. Optical crosstalk also occurs when the pixel size approaches the wavelength of the light. Diffraction causes a sharp increase in the amount of light that reaches adjacent photodiodes rather than the desired photodiode. Electrical crosstalk occurs when photo-generated electrons travel to adjacent pixels through the silicon substrate.

Accordingly, there is a strong need to circumvent these issues by introducing a new type of pixel architecture. Preferably, the new architecture needs to keep the CMOS compatibility for the easiness of the manufacture.

Recently, a nanoscale technology has emerged and opened up a new possibility of designing novel structures and combining materials in ways not possible in CMOS technology. It would therefore be advantageous to have a small pixel as well as the good optical fill factor, low optical crosstalk, and high QE employing the nanoscale technology, in particular, nanowires.

SUMMARY OF INVENTION

A number of technical advances are achieved, by implementation of a nanowire structured photodetector in a passive pixel or passive pixel array of the image sensor formed on a semiconductor substrate. This pixel approach provides a image sensor with a small pixel size, high optical fill factor, low optical crosstalk, and high QE. In accordance with the present invention, the pixel comprises an upstanding nanowire structured photodetector and a switch transistor which is formed in the semiconductor substrate. The nanowire is a very narrow and long cylinder shaped semiconductor element protruding from the substrate and suitable for a photo absorption from above.

In accordance with the present invention, the nanowire structured photodetector is formed with a lightly doped n-type or p-type semiconductor coated with an insulator and a conductor layer which functions as a vertical photo gate.

According to other embodiments, nanowire structured photodetectors are formed as photodiodes in many variations including an axial p-n or p-i-n diode, a coaxial p-n or p-i-n diode. In each case, a pass transistor is formed in the semiconductor substrate.

According to another embodiment, a transfer gate (TX) or a switch transistor is formed at the same body of the nanowire structured photodetector. Additionally, the overall footprint of the photodetector plus the switch transistor is the same size as the pixel size. Therefore, a pixel according to this embodiment can be made very small.

According other embodiments, nanowire structured photodetectors are formed as photodiodes in many variations including an axial p-n or p-i-n diode, a coaxial p-n or p-i-n diode. In each case, a transfer gate (TX) is at the same body of the nanowire structured photodetector.

In another aspect, the device is configured to detect objects of approximately 500 nm or less in size. In another aspect, the device is configured to detect objects of approximately 100 nm or less in size. In another aspect, the nanowire comprises silicon. In another aspect, spacing between nanowires is filled with $SiO_2$. In another aspect, spacing between nanowires is filled with air or vaccuum. In another aspect, the array of pixels are arranged in a penny round pattern. In another aspect, the pixel array pattern comprises equilateral triangles. In another aspect, the active nanowire photodiode comprises a p-i-n junction. In another aspect, the nanowire photodiode comprises a peripheral circuit element. In another aspect, the device further comprises an optical imaging system.

In another aspect, the device further comprises a vertical photogate and dielectric material having a refractive index lower than a refractive index of the nanowire deposited around the nanowire to form a capacitor between the vertical photogate and the nanowire. In another aspect, the vertical photogate is configured to control the potential in the nanowire, forming a potential gradient in the vertical and horizontal directions. In one aspect, In one aspect, each pixel comprises a shallow trench isolation region configured to electrically isolate the pixels from each other. In one aspect, each pixel further comprises an indium tin oxide (ITO) layer and wherein a bias voltage is applied to the pixels through the ITO layer.

In one aspect, the pixels comprise a vertical PIN nanowire structure and a photodiode in the substrate. In one aspect, the vertical p-i-n nanowire structure comprises an intrinsic nanowire core, a p+ layer at the top of the intrinsic nanowire core and an n− region in the substrate below the intrinsic nanowire core. In one aspect, the pixels are configured so that a negative bias applied to the pixel depletes the nanowire of charges and generates a potential gradient in the nanowire that sweeps the charges to the substrate. In one aspect, the nanowire is further coated with a material configured to guide light down the nanowire and reduce optical crosstalk between pixels.

In one aspect, the vertical p-i-n nanowire structure comprises an n− core surrounded with an intrinsic layer, the intrinsic layer surrounded by an p+ layer. In one aspect, the pixels are configured so that the substrate is at electrical ground and a negative bias applied to the pixels allows the nanowire and the substrate to be depleted of charges. In one aspect, the nanowire is configured with two electric filed components, one electric field component directed toward a center of the nanowire and the other directed toward the substrate. In one aspect, charges in the nanowire move toward the center of the nanowire and then toward the substrate.

In one aspect, each pixel comprises a vertical photogate and a switch placed on the nanowire photodiode. In one aspect, the array of pixels is configured in rows and columns and the substrate is comprises an n+ layer configured to connect nanowires in a column. In one aspect, n+ layer in the substrate is configured as a signal line. In one aspect, the pixels are configured such that when the switch is off, a potential barrier is formed underneath the switch, allowing photo-generated charges in the nanowire to accumulate. In one aspect, the nanowire is electrically isolated from the substrate but not optically isolated from the substrate. In one aspect, when the switch is turned on, charges in the nanowire flow into the substrate.

In one aspect, the pixels comprise a vertical p-i-n nanowire structure and a nanowire switch. In one aspect, the vertical p-i-n nanowire structure comprises an intrinsic nanowire core, a p+ layer at the top of the intrinsic nanowire core and an n+ region in the substrate below the nanowire, the substrate having p doping. In one aspect, the nanowire comprises an n− layer between the switch and the intrinsic nanowire core. In one aspect, the n+ region has a substantially annular shape with a hole, the hole configured to provide an electrical path from the intrinsic nanowire to the p doped substrate. In one aspect, the n+ region has a substantially rectangular shape. In one aspect, the vertical p-i-n nanowire structure comprises an n− core surrounded with an intrinsic layer, the intrinsic layer surrounded by an p+ layer.

In one aspect, the vertical p-i-n nanowire structure comprises an intrinsic nanowire core, a p+ layer at the top of the intrinsic nanowire core and an n+ region in below the nanowire, wherein the n+ region is on a metal strip on an insulating layer on the substrate. In one aspect, the n+ region has an ohmic contact with the metal strip. In one aspect, the substrate comprises silicon, a III-V semiconductor, and II-VI semiconductor, or plastic. In one aspect, the pixels do not comprise a photodiode in the substrate. In one aspect, the vertical p-i-n nanowire structure comprises an n− core surrounded with an intrinsic layer, the intrinsic layer surrounded by an p+ layer, the vertical PIN structure further comprising an n+ region in below the nanowire, wherein the n+ region is on a metal strip on an insulating layer on the substrate. In one aspect, the substrate comprises silicon, a III-V semiconductor, and II-VI semiconductor, or plastic.

Another embodiment relates to a method of imaging comprising obtaining a nanowire sensor array comprising an array of pixels, the pixels comprising an active nanowire photodiode and a substrate; placing an object in contact with the nanowire sensor array; exposing the object and sensor to electromagnetic radiation; and detecting an image of the object. In one aspect, the nanowire sensor comprises at least one light source.

In the embodiments disclosed herein, preferably, the core comprises a nanowire waveguide. Preferably, the nanowire element is configured to be a photodiode, a charge storage capacitor, or combinations thereof. More preferably, the core comprises a waveguide comprising a semiconductor material. The device could further comprise a passivation layer around the waveguide in the core. The device could further comprise a metal layer around the waveguide in the core. The device could further comprise a metal layer around the passivation layer. Preferably, the device comprises no color or IR filter. The nanowire optical pipe may be circular, non-circular or conical. If the device has a core and cladding, preferably the core has a core index of refraction ($n_1$), and the cladding has a cladding index of refraction ($n_2$), wherein $n_1 > n_2$ or $n_1 = n_2$.

In some embodiments, the device could further comprise at least a pair of metal contacts with at least one of the metal contacts being contacted to the nanowire waveguide. Preferably, the nanowire is configured to separate wavelengths of an electromagnetic radiation beam incident on the nanowire waveguide at a selective wavelength through the core and the cladding without requiring a color or IR filter. In an embodiment, the nanowire waveguide is configured to convert energy of the electromagnetic radiation transmitted through the waveguide and to generate electron hole pairs. In an embodiment, the waveguide comprises a p-i-n junction that is configured to detect the photo charges generated in the waveguide.

In some embodiments, the device could further comprise a lens structure or an optical coupler over the nanowire waveguide, wherein the optical coupler is operably coupled to the nanowire. Preferably, the optical coupler comprises a curved surface to channel the electromagnetic radiation into the nanowire.

In some embodiments, the device could further comprise a stack surrounding the nanowire waveguide, the stack comprising metallic layers embedded in dielectric layers, wherein the dielectric layers have a lower refractive index than that of the cladding. Preferably, a surface of the stack comprises a reflective surface.

A nanowire waveguide, whether passive or active, has a cutoff wavelength that is the lowest frequency that the waveguide can propagate. The diameter of the semiconductor waveguide of the core serves as the control parameter for the cutoff wavelength of the waveguide e. In some embodiments, the nanowire could be circular in or cross section so as to function as a circular waveguide characterized by the following parameters: (1) the core radius ($R_e$); (2) the core index of refraction ($n_1$); and (3) the cladding index of refraction ($n_2$). These parameters generally determine the wavelength of light that can propagate through the waveguide. A waveguide has a cutoff wavelength, $\lambda_{et}$. The portion of the incident electromagnetic radiation having wavelengths longer than the cutoff wavelength would not be confined with the core. As a result, a nanowire that functions as a waveguide whose cutoff wavelength is at green will not propagate blue light though the core, and a nanowire that functions as a waveguide whose cutoff wavelength is at red will not propagate blue and green light through the core.

The core could serve as a photodiode by absorbing the confined light and generating electron hole pairs. As a result, an active waveguide in the core whose cutoff wavelength is at green will not propagate blue light but will also absorb the confined green light and generate photo charges.

DESCRIPTION OF THE FIGURES

FIG. 4 shows a (a) cross sectional view and (b) top view of an embodiment of pixel with a nanowire and a vertical photo gate.

FIG. 7 shows a (a) cross sectional view and (b) top view of an embodiment of pixel with a nanowire, a vertical photo gate and a nanowire switch transistor.

FIG. 14 shows a (a) cross sectional view and (b) top view of an embodiment of pixel with a nanowire and a vertical photo gate and concentric dielectric layers.

DETAILED DESCRIPTION

Figure 1:
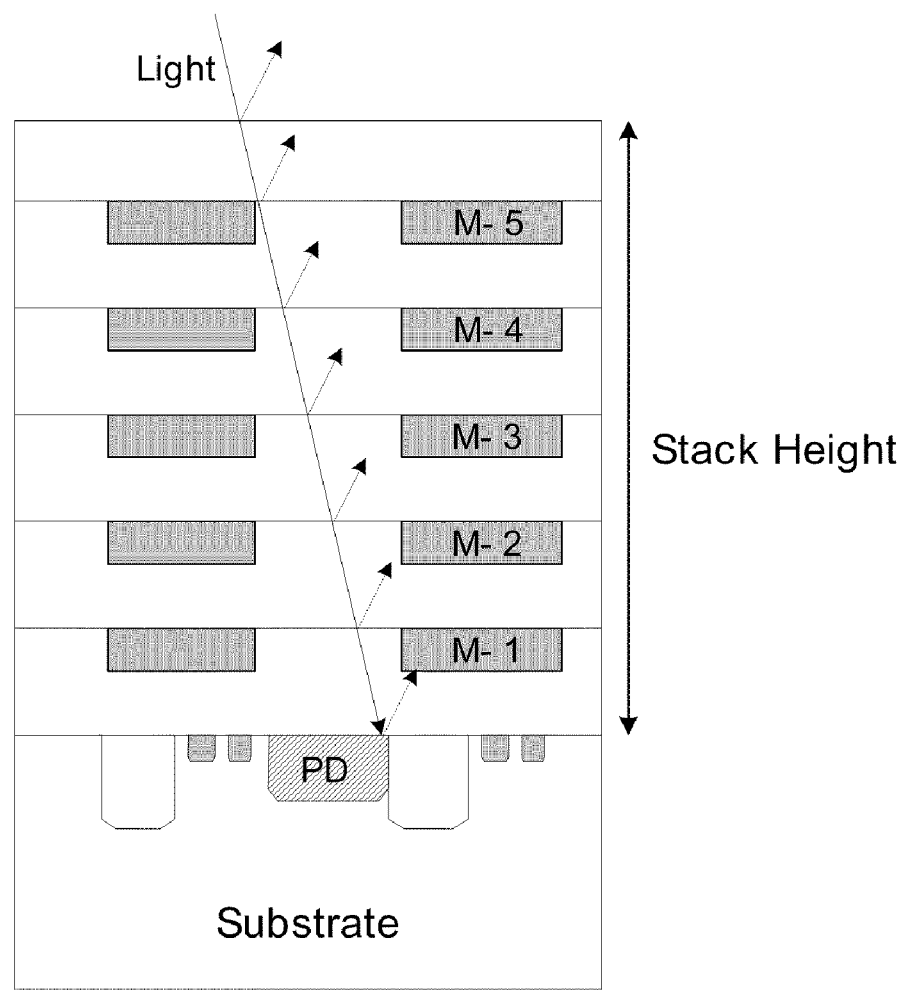
FIG. 1 shows a prior art: a cross section view of a small CMOS pixel

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Symbols for elements illustrated in the figures are summarized in the following table.

| Symbol | Element |
|---|---|
| VPG 1 (VP Gate 1) | The first vertical photogate |
| VPG 2 (VP Gate 1) | The second vertical photogate |
| TX Gate | Transfer gate |
| FD | Transfer drain |
| RG | Reset gate |
| RD | Reset drain |
| Sub | Substrate |
| VDD | Positive transistor voltage |
| Vout | Output voltage |
| NW (nw) | Nanowire |
| de | Dielectric layer |
| I (i) | Current |
| n+, n− | Semiconducting material with excess donors, n+ is heavily doped, n− is lightly doped |
| p+, p− | Semiconducting material with excess acceptors, p+ is heavily doped, p− is lightly doped |
| I | Intrinsic semiconducting material |
| −V | Negative bias voltage |
| STI | Shallow trench isolation |
| TIA | Trans-impedance amplifier |

The term nanowire refers to a structure that has a thickness or diameter of the order of nanometers, for example, 100 nanometers or less and an unconstrained length. An active nanowire is generally capable of converting photons into excitons. Nanowires could include metallic (e.g., Ni, Pt, Au), semiconducting (e.g., Si, InP, GaN, etc.), and insulating (e.g., $SiO_2$, $TiO_2$) materials. Molecular nanowires are composed of repeating molecular units either organic or inorganic. Nanowires could exhibit aspect ratios (length-to-width ratio) of 1000 or more. As such they could be referred to as 1-dimensional materials. Examples of nanowires include inorganic molecular nanowires ($Mo_6S_{9-x}I_x$, $Li_2Mo_6Se_6$), which could have a diameter of 0.9 nm, and can be hundreds of micrometers long. Other examples are based on semiconductors such as InP, Si, GaN, etc., dielectrics (e.g. $SiO_2$, $TiO_2$), or metals (e.g. Ni, Pt).

An active-pixel sensor (APS), also commonly written active pixel sensor, is an image sensor consisting of an integrated circuit containing an array of pixel sensors, each pixel containing a photodetector and an active amplifier. A passive-pixel sensor is a pixel sensor without its own amplifier.

The term excitons refers to electron-hole pairs.

An active element is any type of circuit component with the ability to electrically control electron and/or hole flow (electricity controlling electricity or light, or vice versa). Components incapable of controlling current by means of another electrical signal are called passive elements. Resistors, capacitors, inductors, transformers, and even diodes are all considered passive elements. Active elements include in embodiments disclosed herein, but are not limited to, an active nanowire, an active waveguide, transistors, silicon-controlled rectifiers (SCRs), light emitting diodes, and photodiodes.

A waveguide is a system or material designed to confine and direct electromagnetic radiation of selective wavelengths in a direction determined by its physical boundaries. Preferably, the selective wavelength is a function of the diameter of the waveguide. An active waveguide is a waveguide that has the ability to electrically control electron and/or hole flow (electricity controlling electricity or light, or vice versa). This ability of the active waveguide, for example, is one reason why the active waveguide could be considered to be "active" and within the genus of an active element.

An optical pipe is an element to confine and transmit an electromagnetic radiation that impinges on the optical pipe. The optical pipe can include a core and a cladding. The core could be a nanowire. The optical pipe could be configured to separate wavelengths of an electromagnetic radiation beam incident on the optical pipe at a selective wavelength through the core and the cladding, wherein the core is configured to be both a channel to transmit the wavelengths up to the selective wavelength and an active element to detect the wavelengths up to the selective wavelength transmitted through the core. A core and a cladding are generally complimentary components of the optical pipe and are configured to separate wavelengths of an electromagnetic radiation beam incident on the optical pipe at a selective wavelength through the core and cladding.

A photogate is a gate used in an optoelectronic device. Typically the photogate comprises a metal-oxide-semiconductor (MOS) structure. The photogate controls the accumulation of photo generated charges during the integration time of the photodiode and controls the transfer of charges when integration is over. A photodiode comprises a pn junction, however, a photogate can be placed on any type semiconductor material. A vertical photogate is a new structure. Normally, photogates are placed horizontally on planar photodiode devices. In a nanowire device, however, the photogate can be formed in a vertical direction. That is, the photogate can be oriented standing up covering the lateral surface of the nanowire.

A transfer gate is a gate of a switch transistor used in a pixel. The transfer gate's role is to transfer the charges from one side of a device to another. In some embodiments, the transfer gate is used to transfer the charges from the photodiode to the sensing node (or floating diffusion). A reset gate is a gate used for resetting a device. In some embodiments, the reset gate is the sense node which is formed by an n+ region. Reset means to restore to original voltage level set by a certain voltage. In some embodiments, the voltage of the reset drain (RD) is the voltage used as a reset level.

A floating capacitor is a capacitor which floats relative to the substrate. Normally a capacitor consists of two electrodes and an insulator between them. Typically, both of the electrodes are connected to other devices or to signal lines. In a pixel, often one of the electrodes may not be connected to a structure. This unconnected, isolated area forms the floating capacitor with respect to the substrate. In other words, the isolated area comprises one electrode which is floating. The substrate comprises the other electrode which is normally connected to the ground. A depletion region between them comprises the insulator.

A source-follower amplifier is a common drain transistor amplifier. That is, a transistor amplifier whose source node follows the same phase as the gate node. The gate terminal of the transistor serves as the input, the source is the output, and the drain is common to both (input and output). A shallow layer is a doped layer that is physically located near the surface of the substrate. For example, a p+ layer may be intentionally formed very shallow by using very low energy when ion implantation is used. Normally the junction depth of a shallow layer is 0.01 μm~0.2 μm. In contrast, a deep layer may be as deep as a few μm to tens of μm.

An intrinsic semiconductor, also called an undoped semiconductor or i-type semiconductor, is a pure semiconductor without any significant dopant species present.

Excitons so generated can be detected by using at least one of the following two designs:

(1) A core is made up of a three layers, semiconductor, insulator and metal thus forming a capacitor to collect the charge generated by the light induced carriers. Contacts are made to the metal and to the semiconductor to control and detect the stored charge. The core could be formed by growing a nanowire and depositing an insulator layer and a metal layer surrounding the nanowire.

(2) A core having a PIN junction that induces a potential gradient in the core wire. The PIN junction in the core could be formed by growing a nanowire and doping the nanowire core while it is growing as a PIN junction and contacting it at the appropriate points using the various metal layers that are part of any device.

The photosensitive elements typically comprise a photodiode, although not limited to only a photodiode. Typically, the photodiode is doped to a concentration from about $1 \times 10^{16}$ to about $1 \times 10^{18}$ dopant atoms per cubic centimeter, while using an appropriate dopant.

The dielectric materials include as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant dielectric materials may include, but are not limited to hafnium oxides, hafnium silicates, titanium oxides, barium-strontium titanates (BSTs) and lead-zirconate titanates (PZTs).

Dielectric material-containing layers may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods.

The metal-containing layers could function as electrodes. Non-limiting examples include certain metals, metal alloys, metal silicides and metal nitrides, as well as doped polysilicon materials (i.e., having a dopant concentration from about $1 \times 10^{18}$ to about $1 \times 10^{22}$ dopant atoms per cubic centimeter) and polycide (i.e., doped polysilicon/metal silicide stack) materials. The metal-containing layers may be deposited using any of several methods. Non-limiting examples include chemical vapor deposition methods (also including atomic layer chemical vapor deposition methods) and physical vapor deposition methods. The metal-containing layers could comprise a doped polysilicon material (having a thickness typically in the range 1000 to 1500 Angstrom Individual metallization interconnection studs and metallization interconnection layers that could be used within interconnected metallization layers may comprise any of several metallization materials that are conventional in the semiconductor fabrication art. Non-limiting examples include certain metals, metal alloys, metal nitrides and metal silicides. Most common are aluminum metallization materials and copper metallization materials, either of which often includes a barrier metallization material, as discussed in greater detail below. Types of metallization materials may differ as a function of size and location within a semiconductor structure. Smaller and lower-lying metallization features typically comprise copper containing conductor materials. Larger and upper-lying metallization features typically comprise aluminum containing conductor materials. Metallization layers typically comprise copper metallization materials and aluminum metallization materials. Other metals and alloys may be used as well.

Dielectric and metallization layers may be patterned using wet chemical etch methods, dry plasma etch methods or aggregate methods thereof. Dry plasma etch methods as well as e-beam etching if the dimension needs to be very small, are generally preferred insofar as they provide enhanced sidewall profile control when forming the series of patterned dielectric and metallization layers. The waveguiding properties of the optical pipe of the embodiments can be improved in different ways. The waveguide core has a first effective refractive index, $n_1$, and the material in the cladding surrounding at least a portion of the waveguide has a second effective refractive index, $n_2$, and by assuring that the first refractive index is larger than the second refractive index, $n_1 > n_2$, good waveguiding properties are provided to the optical pipe. The waveguiding properties may be further improved by introducing optically active cladding layers on the waveguide core. The nanowire core is used as a waveguide, and also as a nanostructured PD which may also be an active capacitor. The nanostructured PD according to the embodiments is well suited for mass production, and the method described is scaleable for industrial use.

The nanowire technology offers possibilities in choices of materials and material combinations not possible in conventional bulk layer techniques. This is utilized in the nanostructured PD according to the embodiments to provide PDs detecting light in well defined wavelength regions not possible by conventional technique. The design according to the embodiments allows for inclusions of heterostructures as well as areas of different doping within the nanowire, facilitating optimization of electrical and/or optical properties.

The waveguiding properties of the optical pipe of the embodiments can be improved in different ways. The waveguide core has a first effective refractive index, $n_1$, and the material in the cladding surrounding at least a portion of the waveguide has a second effective refractive index, $n_2$, and by assuring that the first refractive index is larger than the second refractive index, $n_1 > n_2$, good wave-guiding properties are provided to the optical pipe. The waveguiding properties may be further improved by introducing optically active cladding layers on the waveguide core. The nanowire core is used as a waveguide, and also as a nanostructured PD which may also be an active capacitor. The nanostructured PD according to the embodiments is well suited for mass production, and the method described is scaleable for industrial use.

A nanostructured PD according to the embodiments comprises of an upstanding nanowire. For the purpose of this application an upstanding nanowire should be interpreted as a nanowire protruding from the substrate in some angle, the upstanding nanowire for example being grown from the substrate, preferably by as vapor-liquid-solid (VLS) grown nanowires. The angle with the substrate will typically be a result of the materials in the substrate and the nanowire, the surface of the substrate and growth conditions. By controlling these parameters it is possible to produce nanowires pointing in only one direction, for example vertical, or in a limited set of directions. For example nanowires and substrates of zinc-blende and diamond semiconductors composed of elements from columns III, V and IV of the periodic table, such nanow-ires can be grown in the [111] directions and then be grown in the normal direction to any {111} substrate surface. Other directions given as the angle between normal to the surface and the axial direction of the nanowire include 70.53° {111}, 54.73° {100}, and 35.27° and 90°, both to {110}. Thus the nanowires define one, or a limited set, of directions.

The ability to grow nanowires with well defined diameters is in one embodiment utilized to optimize the waveguiding properties of the nanowire or at least the waveguide with regards to the wavelength of the light confined and converted by the nanostructured PD. The diameter of the nanowire is chosen so as to have a favorable correspondence to the wavelength of the desired light. Preferably the dimensions of the nanowire are such that a uniform optical cavity, optimized for the specific wavelength of the produced light, is provided along the nanowire. The core nanowire must be sufficiently wide to capture the desired light. A rule of thumb would be that diameter must be larger than $\lambda/2_w$, wherein $\lambda$ is the wavelength of the desired light and $n_w$ is the refractive index of the nanowire. As an example a diameter of about 60 nm may be appropriate to confine blue light only and one 80 nm may be appropriate for to confine both blue and green light only in a silicon nanowire. A diameter of 45 nm may be appropriate to confine UV light.

The silicon nanowire of the embodiments disclosed herein could be made as follows. A substrate is provided which comprises silicon having a silicon dioxide surface. The surface can be modified with a surface treatment to promote adsorption of a gold nanoparticle. Onto this modified surface, the gold nanoparticle can be formed by deposition of a gold layer, followed by removal of the gold layer over regions other than desired location of the gold nanoparticle. The gold nanoparticle can be surface treated to provide for steric stabilization. In other words, tethered, sterically stabilized gold nanoparticles can be used as seeds for further synthesis of nanowires, wherein the gold nanoparticles are adsorbed to the modified silicon substrate. The degradation of diphenyl silane (DPS) to forms silicon atoms. The silicon atoms attach to the gold nanoparticle and a silicon nanowire crystallizes from the gold nanoparticle seed upon saturation of the gold nanoparticle with silicon atoms. Note that the thickness and diameter of the gold particle left behind on the back-side surface determines the diameter of the nanowire.

A silicon nanowire can be grown, for example, by plasma enhanced vapor-liquid-solid growth. Other methods of growing silicon nanowire could employ the vapor-liquid-solid (VLS) growth mechanism. The nanowires could also be epitaxially grown Si-NWs synthesized by the VLS growth mechanism using silicon tetrachloride ($SiCl_4$) as precursor gas, requiring temperatures beyond 800° C. In this case, the gaseous hydrochloric acid, a byproduct of $SiCl_4$ decomposition in the reaction tube, could etch the oxide layer on the Si surface, creating a clean Si crystal surface for epitaxial NW growth. Epitaxial silicon could also be grown selectively by intentionally introducing HCl into the $SiH_4/H_2$ system. Epitaxial growth of Si-NWs may be accomplished using a gallium/gold (Ga/Au)-nanoparticle-catalyzed chemical vapor deposition (CVD) of $SiH_4$ on Si (111) and Si (100) surfaces.

The silicon nanowire of the embodiments disclosed herein could be made as follows. A substrate is provided which comprises silicon having a silicon dioxide surface. The surface can be modified to remove an oxide layer with a surface treatment to promote adsorption of a gold nanoparticle, or gold alloys nanoparticle like AuGa. Onto this modified surface, preferably a Si substrate have the {111} plane, (Au is used to create the Si—Au eutectic point and grow the Si nanowire when SiH4 is introduced), the gold nanoparticle can be formed by deposition of a gold layer, followed by removal of the gold layer over regions other than desired location of the gold nanoparticle. The silicon nanowire can be grown, for example, by plasma enhanced vapor-liquid-solid growth. In a first step, a catalyst particle (typically gold or gold alloy) may be deposited on top of the substrate by either a standard electron beam lithography (EBL) process or using self-assembly of prefabricated catalyst colloids. Other processes for depositing catalysts, such as electroless plating may also be used.

The diameters of nanowires after growth are generally determined by the area of the catalyst particles. Therefore, a desired diameter of the nanowire can be synthesized by depositing a catalyst particle with an appropriate size. This step typically determines the functionality of the nanowire pixel because the nanowire diameter should be of an appropriate cross-section area to allow the transmission of light with specific wavelengths and long enough to allow the light absorption and creation of excitons (electron-hole pairs).

A single nanowire can be grown from the catalyst particle under proper conditions. Using silicon as an example, a suitable nanowire can be grown using the vapor-liquid-solid (VLS) process with presence of $SiH_4$ at, for example, temperature at 650 C and pressure of 200 mTorr. A temperature below 450 C is advisable for the integration compatibility of CMOS circuits and nanowire synthesis. Many researchers have been able to synthesize silicon nanowires at 430 C or even below 400 C by using some special techniques, for example, using aluminum catalysts or plasma enhanced growth. During the VLS process, the silicon nanowire can be doped to create a $p^+$-i(intrinsic)-$n^+$ structure by introducing $B_2H_6$, $H_2$ and $PH_3$, respectively.

Nanowires have a higher surface-to-volume ratio than the corresponding bulk materials. Therefore the surface states of nanowires play a more important role in their electronic and optical properties. The impact of nanowire surface states, however, can be minimized by surface passivation after the nanowire synthesis. Typically, surface passivation can be achieved with a monolayer of materials to react with silicon dangling bonds at the surface of the nanowire. This is accomplished with the formation of stable bonds after reaction. Advantageously, passivation has almost no effect on the nanowire physical dimension since it is only one-monolayer thick.

Subsequent steps could relate to the forming of an epitaxial layer that is n or p doped covering the nanowire or of one or more of the dielectric layers around the nanowire.

The epitaxial n or p doped layer covering the nanowire could be grown using vapor-phase epitaxy (VPE), a modification of chemical vapor deposition. Molecular-beam epitaxy, liquid-phase epitaxy (MBE and LPE) and solid-phase epitaxy (SPE) could also be used. In each of these processes, a dopant could be added into the epitaxially grown layer during the epitaxial layer growth process.

A conformal dielectric coating around the nanowire, if needed, could be made by chemical vapor deposition (CVD), atomic layer deposition (ALD), oxidation or nitration could be made around the nanowire. Then, doped glass dielectric layer could be formed on the conformal dielectric coating by plasma enhanced chemical vapor deposition, spin-on coating or sputtering, optionally with an initial atomic layer deposition. The deposited doped glass dielectric layer could be etched back by chemical-mechanical planarization or other methods of etching.

Figure 2:
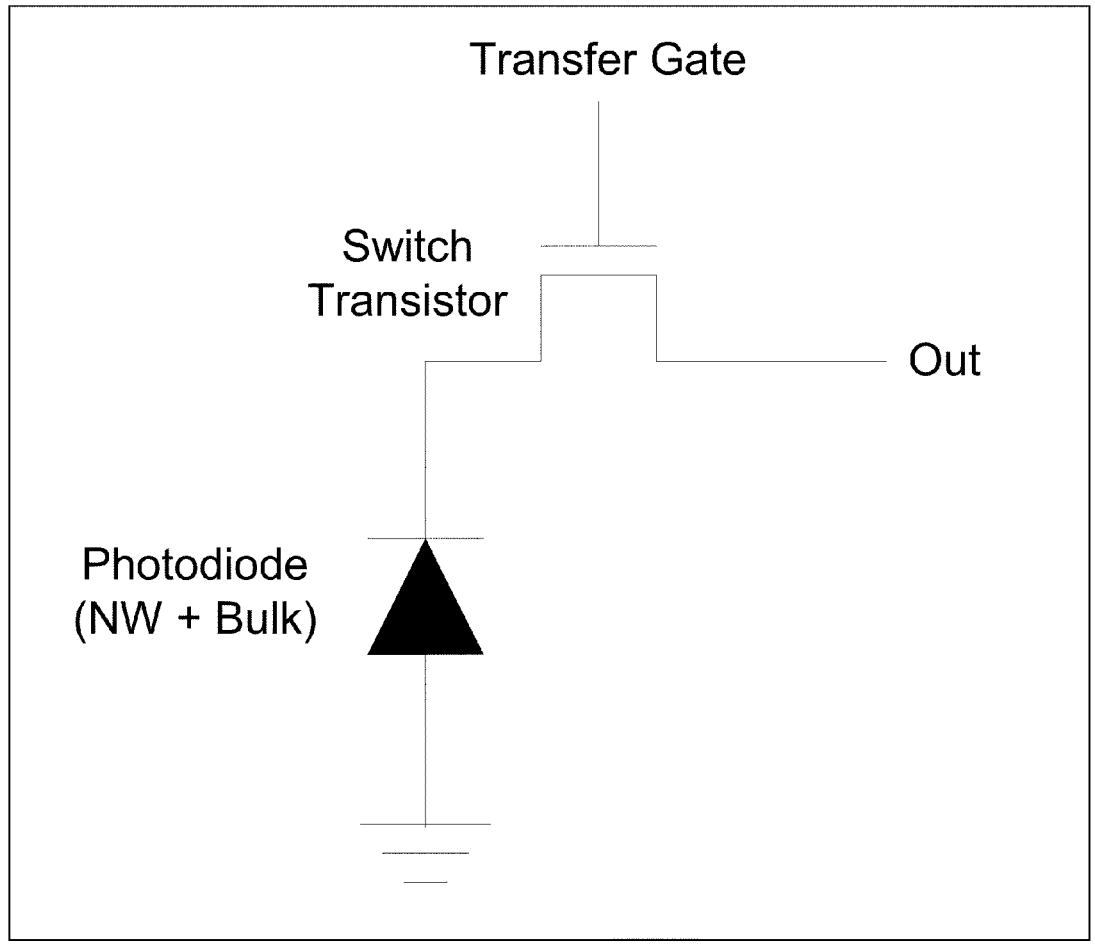
FIG. 2 is a schematic illustration of a pixel of an embodiment.

FIG. 2 is a schematic illustration of a passive pixel according to an embodiment. The passive pixel according to this embodiment includes a photodiode and a switch transistor. When photon energy is absorbed in a photodiode, electron and hole charges are generated. Among the electrons and holes the minority charge carriers are integrated in the potential well formed in the photodiode. The integration of the minority charges continues until a switch transistor is turned on.

Turning on the transfer gate causes the integrated charges to dump into the output node. The output signal is in the form of current flow that flows for a short period of time. The time period is short because the amount of charge stored in the photodiode is limited. When the transfer of charges to the output node is completed, the potential well in the photodiode becomes empty. That is, the photodiode is in a reset state.

When the switch transistor is turned off, integration of the charges resumes. The charges are integrated in order to build up the signal to make the signal large. Absent integration, the signal is typically too small to use. Further, since the readout operation of the pixel is periodic rather than continuous, operation of the transfer gate and sampling of the output signal should be synchronized.

Figure 3:
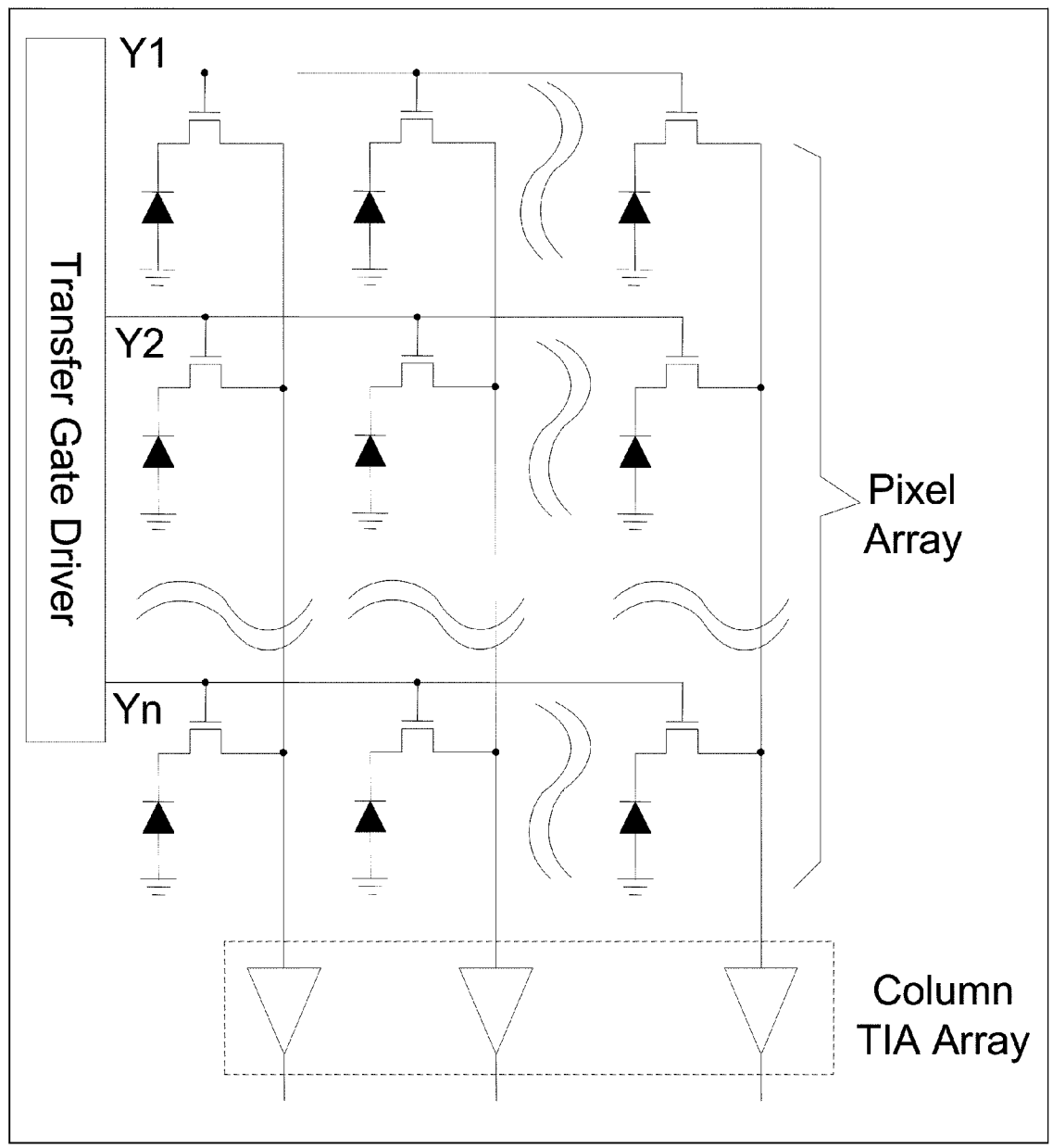
FIG. 3 is a schematic illustration of a pixel array of an embodiment.

The synchronization operation can be understood with reference to FIG. 3. FIG. 3 illustrates a simplified passive pixel array device block diagram. As illustrated, the passive pixel array includes m×n pixels. The array, however, may include n rows and m columns, where m and n are different. Typically, each pixel output in a column is connected to a column signal bus. In one embodiment, each column signal bus is connected to the input of a trans-impedance amplifier (TIA). The TIA converts the photocurrent signal into a voltage signal. In one embodiment, each transfer gate in a row is connected to a single bus line which is driven by a vertical driver.

The method of operation of the pixel array will now be explained. Initially, a transfer gate driver (TGD) enables Y1 so that the pixel group in the first row can be enabled to dump the charges in the first row to the column signal bus. The TIA converts the current signal into a voltage signal. When the readout is finished, Y1 is disabled. Then Y2 is enabled. This process repeats until the pixel group in the last row is enabled by Yn. In this way, the m×n pixel array is scanned in a vertical direction. In the horizontal direction, each output of the TIA's may be scanned using a multiplex switch array (not shown).

FIG. 4 illustrates a (a) cross sectional view and (b) top view of an embodiment of pixel with a nanowire and a vertical photo gate. In this embodiment, there are two photodiode components, a nanowire photodiode and bulk or substrate photodiode. Photons are absorbed in the n− nanowire and n− bulk diode. The pixel of this embodiment, however, can not separate the signals between two photodiodes.

The nanowire and bulk photodiodes comprise n− doped regions which allow easy depletion in a reversed bias condition. A reversed bias condition may be set up by applying a negative voltage (−V) with a vertical photo gate and a ground bias at the substrate. The n+ output node is normally positively biased. This typically helps to deplete the n− regions further. The p+ regions surrounding the nanowire edges serve to suppress the leakage current generated during the integration. Leakage current is typically generated due to the surface defect which exist near the edges and surface of the bulk photodiode area.

In this embodiment, a dielectric material whose refractive index is lower than the core material of the nanowire is deposited to form a capacitor between the vertical photogate (VPG) and the nanowire. The dielectric layer also helps guide the light beam toward the bulk diode.

The pixel also includes a shallow trench isolation (STI). STI is a part of the standard CMOS process which may be used to define the field area opposite the active area where the thin gate oxide is located. That is, STI may be used to electrically isolate components of the pixel. Alternative to STI, Local Oxidation of Silicon or LOCOS may be used to separate componenets in the pixel.

In this embodiment, a vertical photo gate (VPG) bias is applied through an indium-tin-oxide (ITO) layer comprising the top of the pixel. The VPG serves two functions. First, the VPG may be used to control the potential in the nanowire. This enables a potential gradient to form in the nanowire in both the vertical direction and the horizontal direction. Second, the VPG allows the nanowire and the bulk photodiodes to deplete.

The ITO layer serves as a conductive layer to supply the bias voltage to the VPG. The deposition process temperature of ITO is relatively low (typically 200 C~400 C). The low deposition temperature helps prevent damage of the CMOS devices that have already been fabricated in the substrate. ITO has a further advantage in that it is optically transparent.

Figure 5:
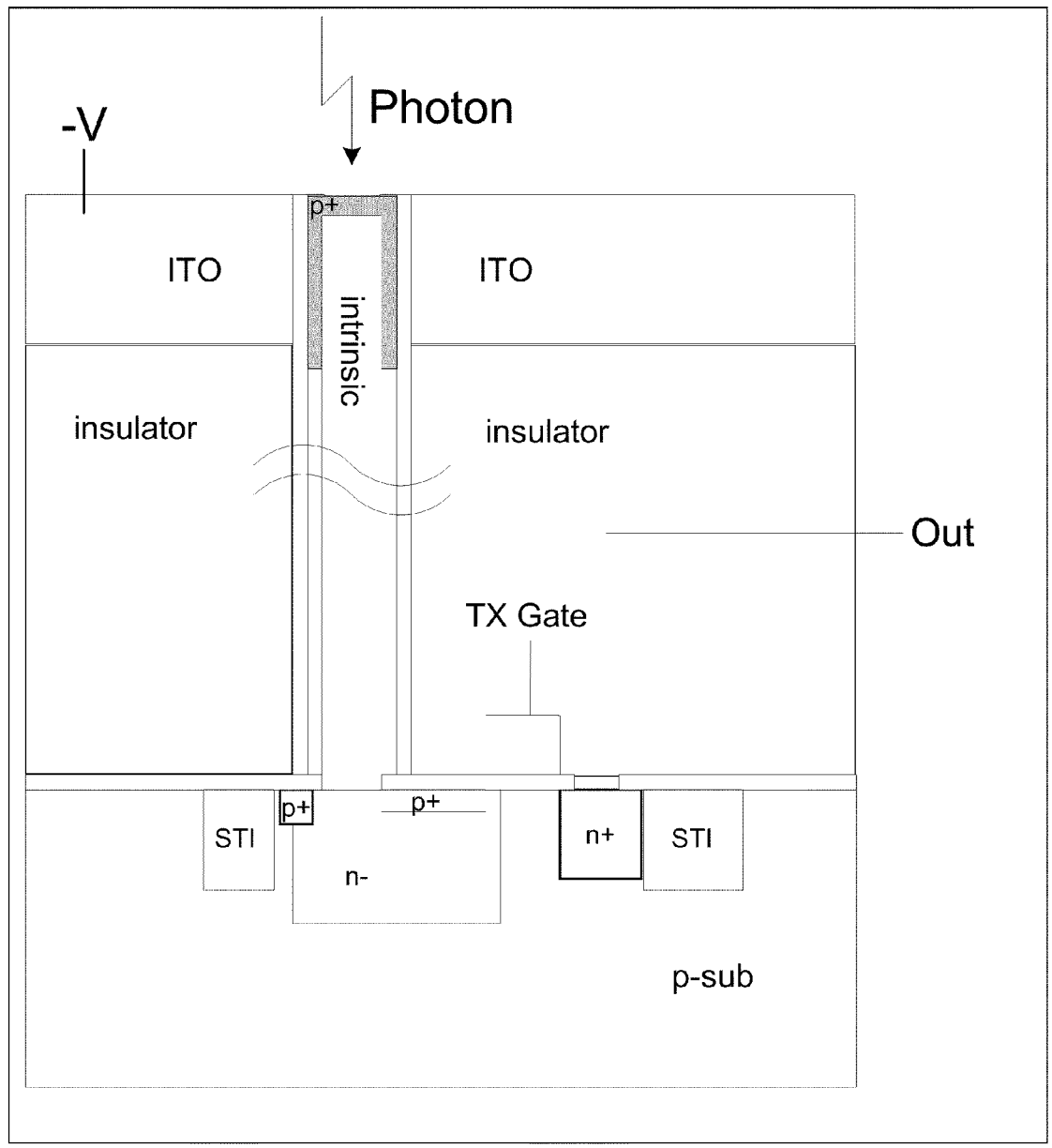
FIG. 5 shows a cross sectional view of an embodiment of pixel with a vertical p-i-n nanowire photodiode and a bulk photodiode.

FIG. 5 illustrates an embodiment of pixel with a vertical pin nanowire and a bulk photodiode. This embodiment includes two photodiode components. The nanowire photodiode is formed as a vertical p-i-n diode. It has a p+ layer at the top of the nanowire and an n− region at the bottom (in the substrate). The rest of the nanowire is coated with a dielectric material, typically an oxide material. The resulting structure may then be surrounded with a metal or conductor material so that light can be guided down the nanowire without causing optical crosstalk between the neighboring nanowire's. The n− region functions as the bulk diode. That is, the n− region absorbs the light coming though the nanowire.

A negative bias, which is denoted by −V, depletes the intrinsic (undoped) nanowire and the n− region. Further, a vertical electrical field is generated in the nanowire. The vertical electric field in the intrinsic region of the nanowire sweeps the photo generated charges toward the n− region where the potential well is located.

Figure 6:
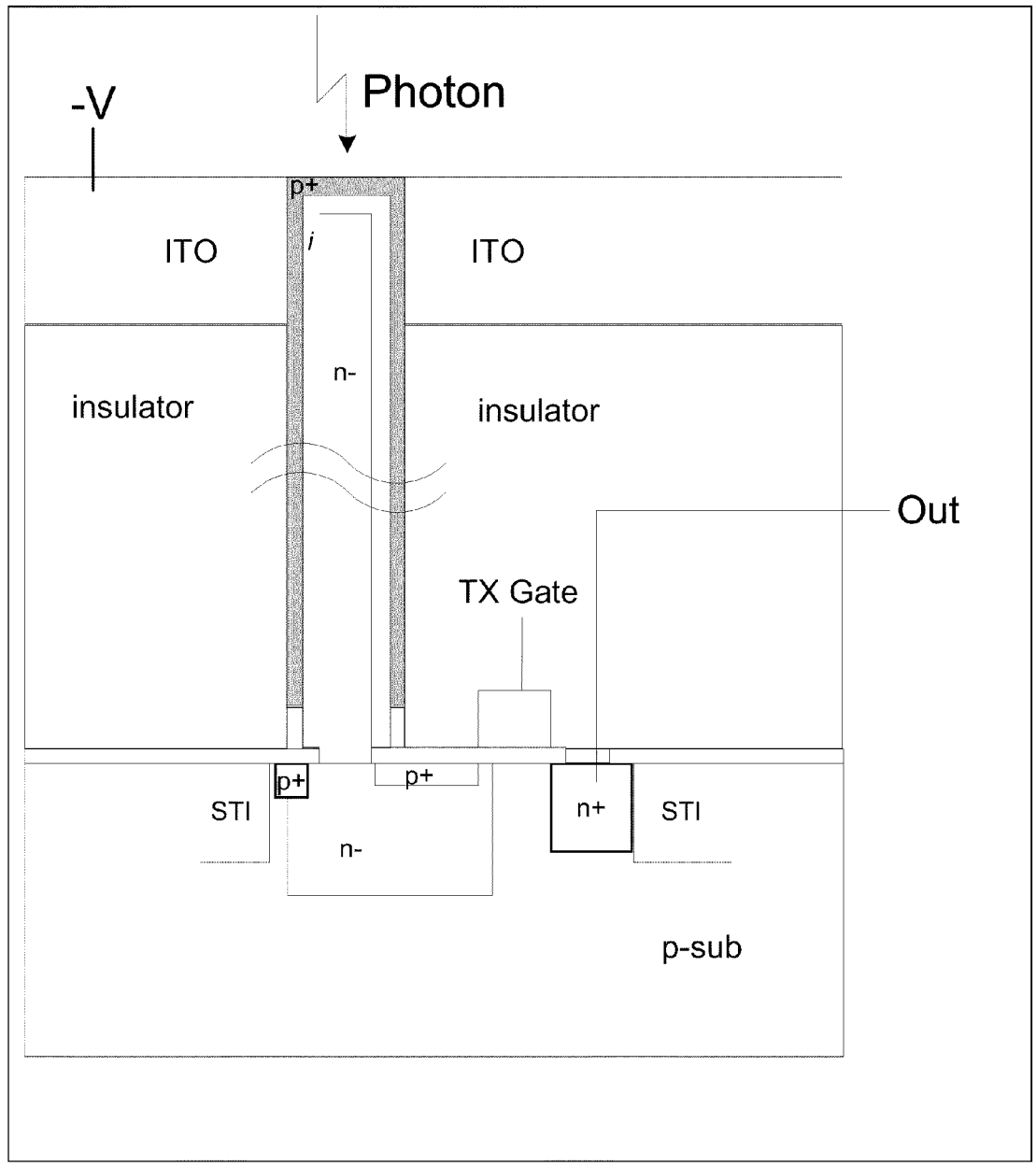
FIG. 6 shows a cross sectional view of an embodiment of pixel with a coaxial p-i-n nanowire photodiode.

FIG. 6 illustrates an embodiment of pixel with a coaxial p-i-n nanowire. The nanowire photodiode is formed as a coaxial or concentric p-i-n diode. It has p+ at the outer shell and n− at the core and an intrinsic layer sandwiched between.

A negative bias, which is denoted by −V, is applied to the p+ layer through the ITO layer. The p− substrate is ground (OV) biased so that the intrinsic layer, the n− region of the nanowire and the n− region in the bulk can be depleted. The n+ output node is normally positively biased. This helps to further deplete the n− regions.

In this embodiment, there are two electric field components in the coaxial nanowire. One component is an electric field directed toward the center of the nanowire. The other is directed in downward direction. That is, toward the substrate. There are two electric field components because the n− region in the core of the nanowire has a lower resistivity than that of the intrinsic layer. In the extreme case of an insulator which has an infinite resistivity, the highest electric field component would be between the two electrodes. That is, toward the center of the nanowire in the configuration of this embodiment. The vertical electric field component is established even if the potential gradient is not steep. This is because the nanowire is long and the substrate is connected to ground.

Due to these two electric field components, charges in the nanowire tend to move into the core first and then move toward bottom in the core. This is generally beneficial because the surface of the nanowire is typically not perfect. That is, typically there are defects at the nanowire surface. If the charge move near the surface, they may experience trapping due to the defects. Charge transfer in the core, however, avoids this issue.

Deposition of the intrinsic layer and the p+ layer can be done by employing atomic layer deposition (ALD) or chemical vapor deposition (CVD) process technology.

FIG. 7 illustrates a (a) cross sectional view and (b) top view of an embodiment of pixel with a nanowire, a vertical photo gate and a nanowire switch transistor. In this pixel structure, a switch transistor is formed in the nanowire. Since both the photodiode and the switch transistor are placed in the same nanowire which is standing up vertically, its footprint is the same size as the pixel size. Therefore, a pixel according to this embodiment can be made very small.

As shown in FIG. 7b, this embodiment includes an n+ layer in the form of a stripe in the vertical (column) direction of the pixel array. Since the n+ layer has a low resistivity, a signal line can be made without using any additional metal lines. This will typically simplify the device fabrication of this embodiment.

When the Gate is off, a potential barrier is formed underneath the Gate so that photo generated charges can be integrated in the nanowire without the charges moving into the n+ region in the substrate. When the Gate is turned off, the nanowire is electrically isolated from the substrate. The nanowire, however, is not optically isolated from the substrate. Therefore, light can reach the n+ region and the substrate p-sub, generating charges at the bottom (substrate) diode.

Charges generated in the bulk diode can not be used, however, because the n+ region is shared with pixel ground in a column of the array. Therefore, before reading out the nanowire signal, it is necessary to rest the n+ region. Reset can be accomplished by the reset operation of the TIA located at each column. When the Gate is turned on, integrated charges in the nanowire are dumped into the n+ region because the potential barrier may be removed by applying an appropriate bias voltage to the Gate. The TIA then converts the current signal from the pixel charge flow into a voltage signal.

Figure 8A:
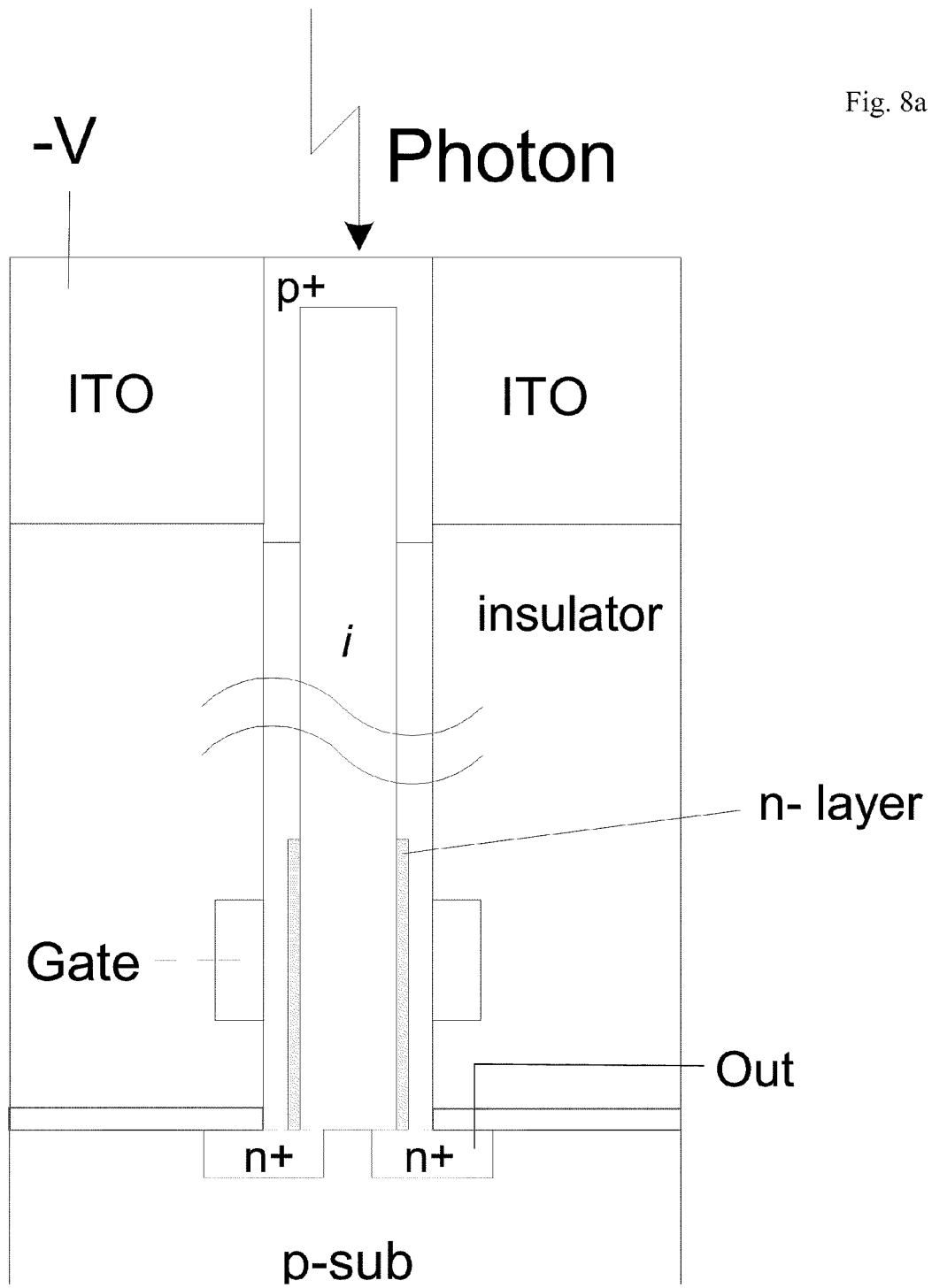
FIG. 8 shows a (a) cross sectional view and (b) top view of an embodiment of pixel with a vertical p-i-n nanowire photodiode and a nanowire switch transistor.

FIG. 8 shows a (a) cross sectional view and (b) top view of an embodiment of pixel with a vertical p-i-n nanowire photodiode and a nanowire switch transistor. The nanowire has a vertical p-i-n structure with a p+ layer at the top portion of the nanowire and n+ and n− layers at the bottom. When the Gate is off, a potential barrier is formed underneath the Gate so that photo generated charges can be integrated in the nanowire without moving into the n+ region at the bottom of the nanowire. During the time the Gate is off, charges are collected in the n− layer above the Gate because the n− layer is the place where the lowest potential (highest voltage) exists. This is because charges have a tendency to go to the place where the potential is lowest. If the nanowire did not have an n− layer, the collection area for the charge would not be well defined.

When the Gate is turned on, an electric field in the vertical direction causes the charges accumulated in the n− layer above the Gate to drift into the n+ region. This results in a pixel output current.

FIG. 8b illustrates that shape of the n+ layer. The reason for the hole in the circular shape is to provide a path from the substrate p-sub to the intrinsic nanowire. This helps build a potential barrier underneath the Gate because a reverse bias may be supplied from the p-sub.

Figure 9:
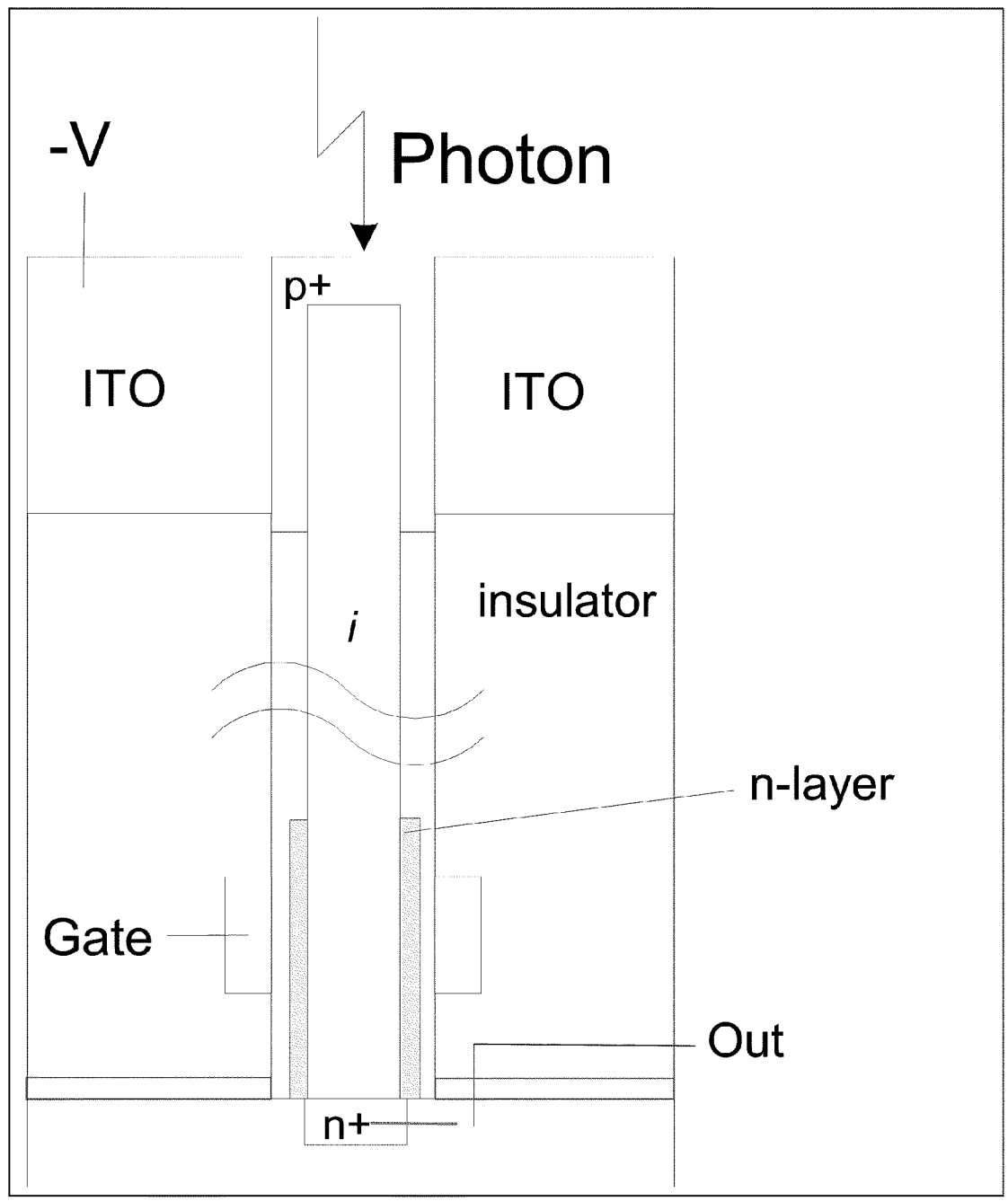
FIG. 9 shows a cross sectional view of an embodiment of pixel with a vertical p-i-n nanowire photodiode and a nanowire switch transistor.

FIG. 9 shows a cross sectional view of an embodiment of pixel with a vertical p-i-n nanowire photodiode and a nanowire switch transistor. Everything in this embodiment is the same as the embodiment illustrated in FIG. 8a except shape of the n+ region. In this embodiment, the n+ regions has a simple stripe without the additional annular pattern.

Figure 10:
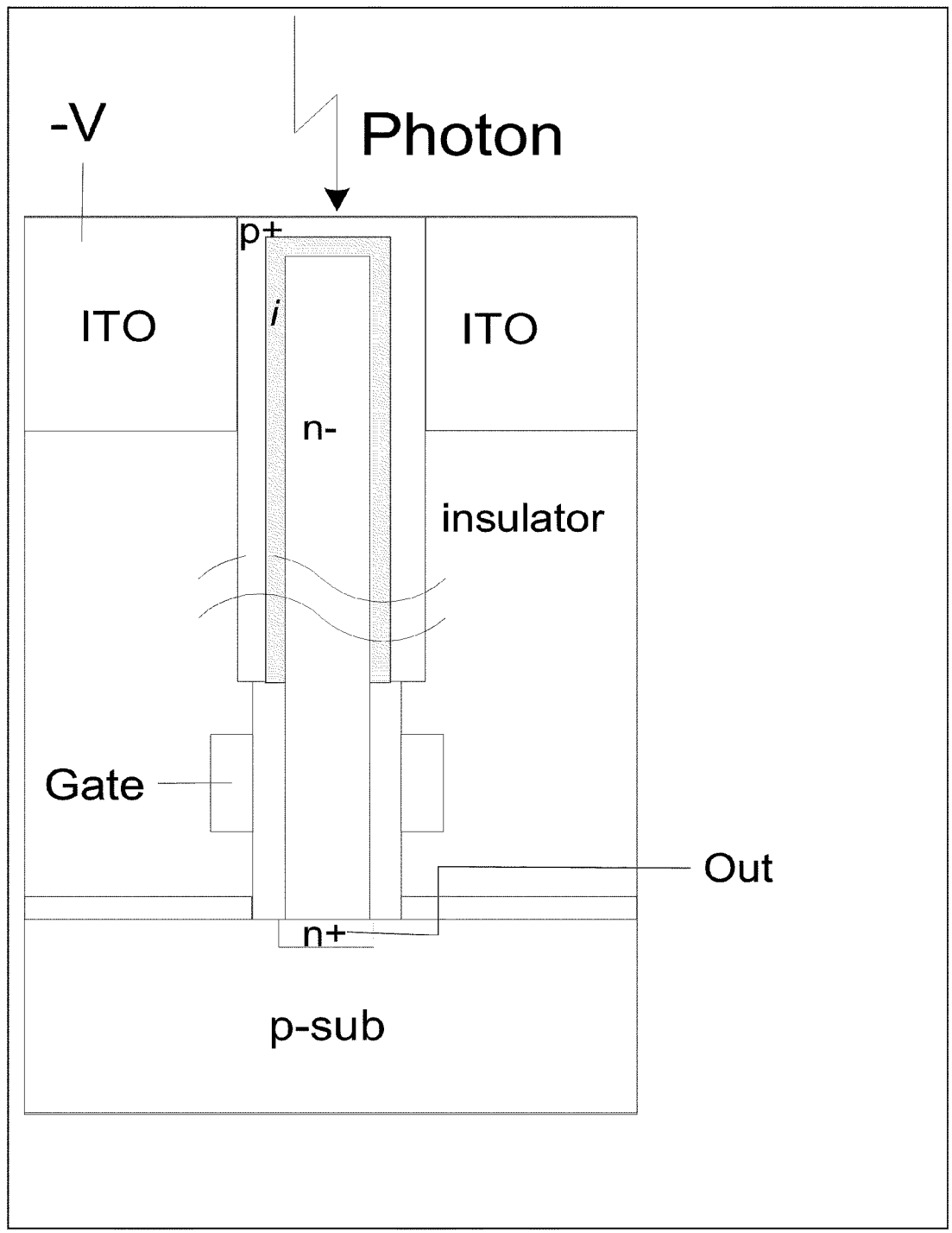
FIG. 10 shows a cross sectional view of an embodiment of pixel with a coaxial p-i-n nanowire photodiode and a nanowire switch transistor.

FIG. 10 shows a cross sectional view of an embodiment of pixel with a coaxial p-i-n nanowire photodiode and a nanowire switch transistor. The nanowire has a coaxial or concentric shaped p-i-n structure. That is, the nanowire has a p+ layer at the outer shell and an n− region in the core with an intrinsic layer sandwiched between the two. When the Gate is off, a potential barrier is formed underneath the Gate. Photo generated charges can be integrated in the nanowire without moving into the n+ region at the bottom.

When the Gate is turned on, an electric field in the vertical direction will cause the charges accumulated in the n− layer above the Gate to drift into the n+ region. This results in a current as a pixel output. The coaxial p-i-n structure helps improve the charge transfer without experiencing trapping due to surface defects in the nanowire. This is because the electric field directed toward the core results in a charge transfer path to the core of the nanowire.

Figure 11:
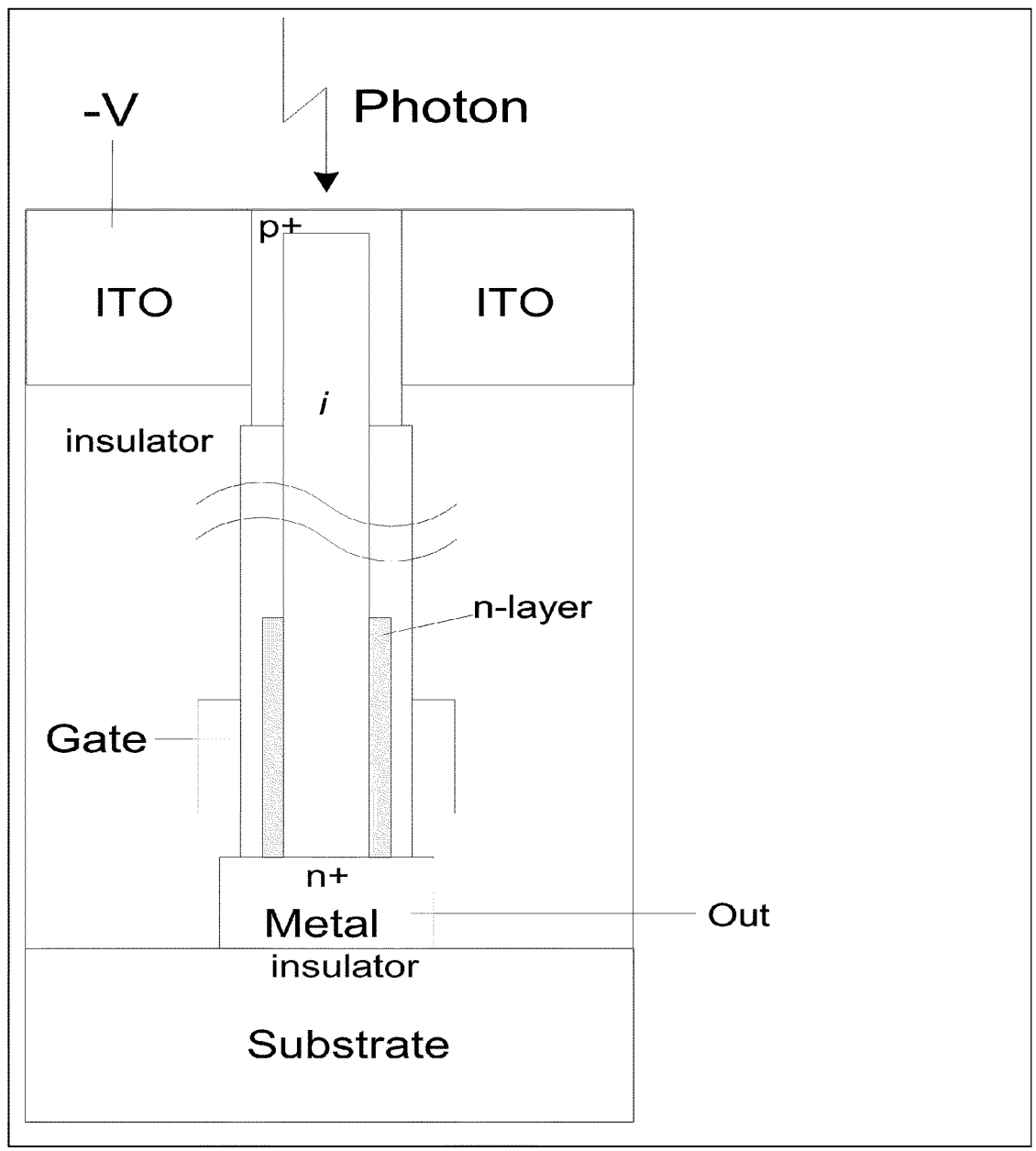
FIG. 11 shows a cross sectional view of an embodiment of pixel with a vertical pin p-i-n nanowire photodiode and a nanowire switch on a metal strip line.

FIG. 11 shows a cross sectional view of an embodiment of pixel with a vertical pin nanowire and a nanowire switch on a metal strip line. In this structure, the nanowire is formed on top a metal stripe which is placed on the insulated substrate. On top of the metal, an n+ material which has a <111> orientation is either deposited or is bonded so as to have an ohmic contact with metal. Then, an intrinsic type nanowire is formed. The top portion of the nanowire is coated with a p+ doped material so that a vertical p-i-n diode can be formed. A negative bias voltage may be applied to the p+ layer through the ITO layer. The bottom metal stripe may be biased positively through a TIA. This causes a reverse bias which results in the nanowire being depleted.

The operation of the pixel of this embodiment is same as the structure shown in FIG. 9. This structure, however, has several advantages over that embodiment. For example, with this embodiment there is more freedom when choosing the substrate material. That is, the substrate need not be silicon. The substrate may be, for example, a III-V semiconductor, a II-VI semiconductor, or a plastic. Indeed, in this embodiment, the substrate may be any material which is capable of providing mechanical support for the pixels. That is, because the substrate is electrically isolated from the pixels, the substrate does not have to be able to conduct electricity. Additionally, the nanowire and the substrate can comprise different materials. For example, the substrate can comprise silicon while the nanowire can comprise a III-V or II-IV material. Since there is no bulk diode, it is unnecessary to reset the n+ diode if the n+ layer is very thin. In other words, even without a bulk diode, the n+ layer on top of the metal becomes a parasitic bulk diode. If the thickness of the n+ layer is small, charge generation in n+ layer can be negligibly small.

Figure 12:
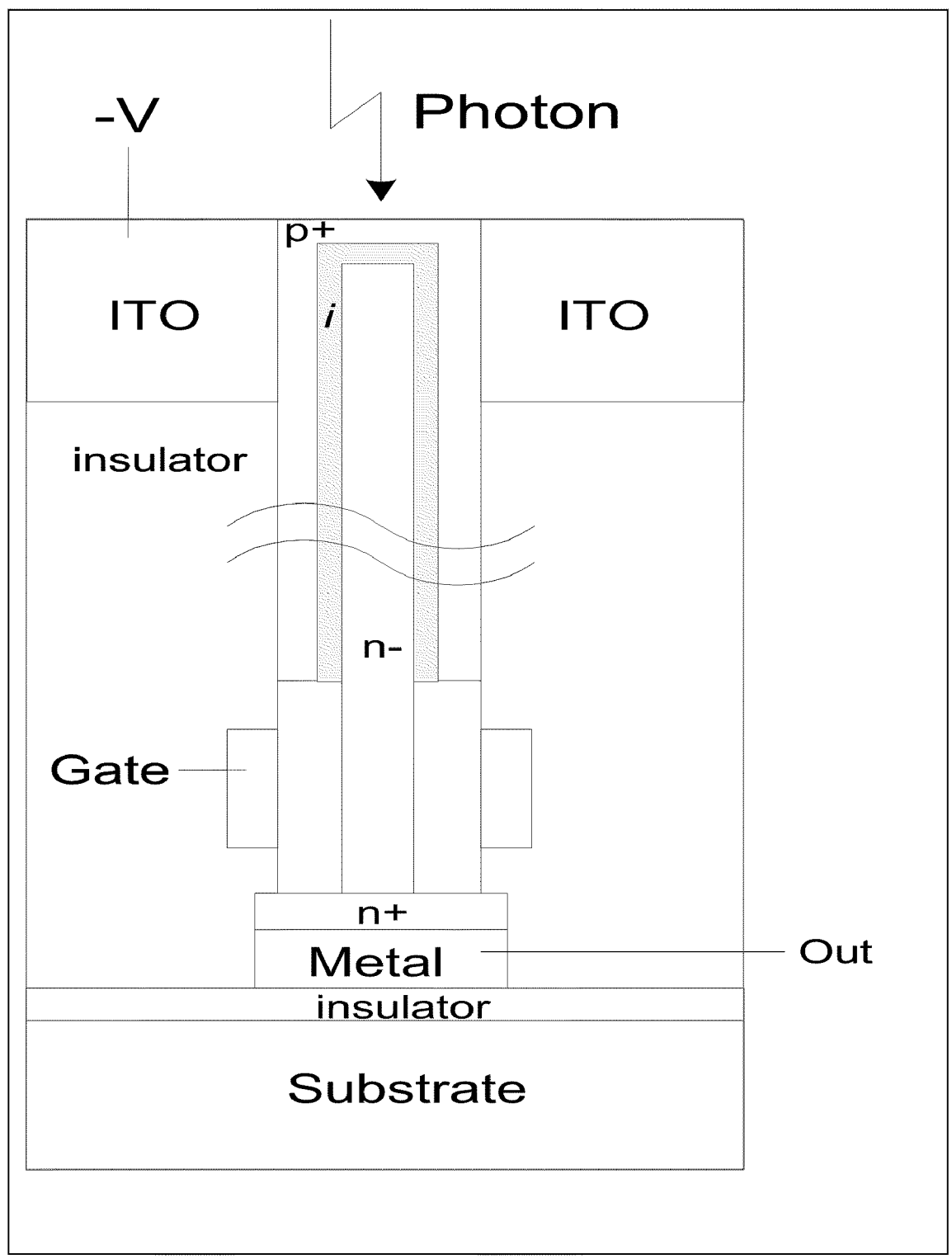
FIG. 12 shows a cross sectional view of an embodiment of a passive pixel with a coaxial p-i-n nanowire photodiode and a nanowire switch on a metal strip line.

FIG. 12 shows a cross sectional view of an embodiment of a passive pixel with a coaxial p-i-n nanowire photodiode and a nanowire switch on a metal strip line. Everything in this embodiment is the same as in the embodiment illustrate in FIG. 11, except this embodiment has a coaxial p-i-n nanowire structure.

Figure 13:
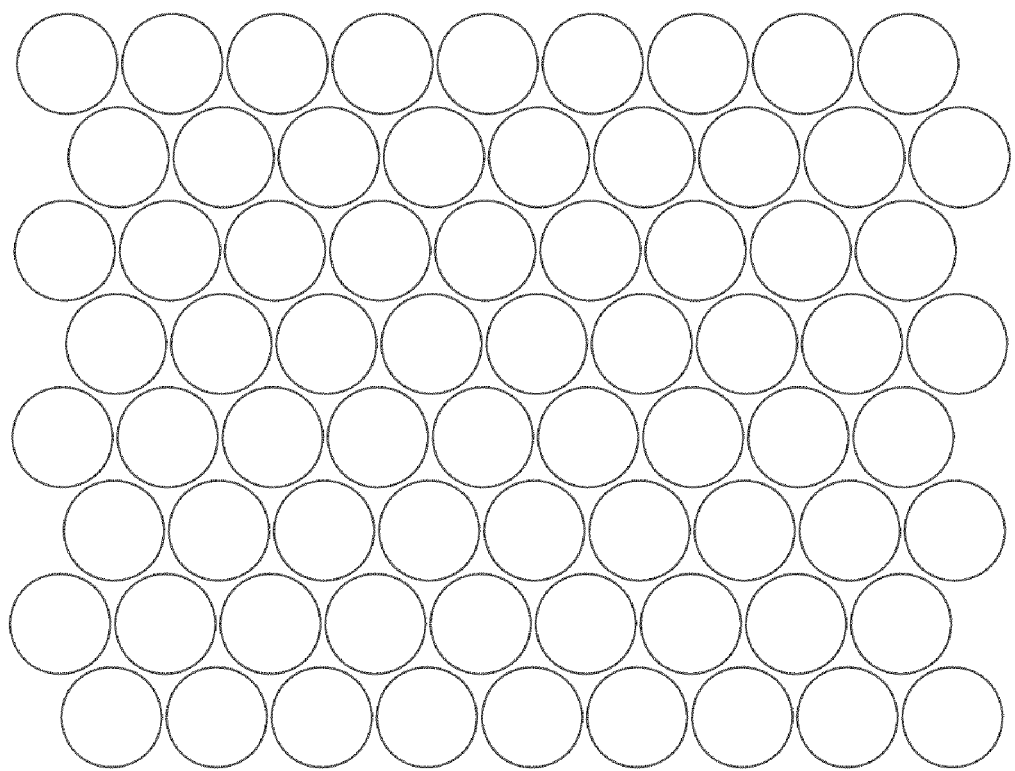
FIG. 13 shows a top view of an embodiment of an pixel array arranged in a penny round pattern.
Figure 15:
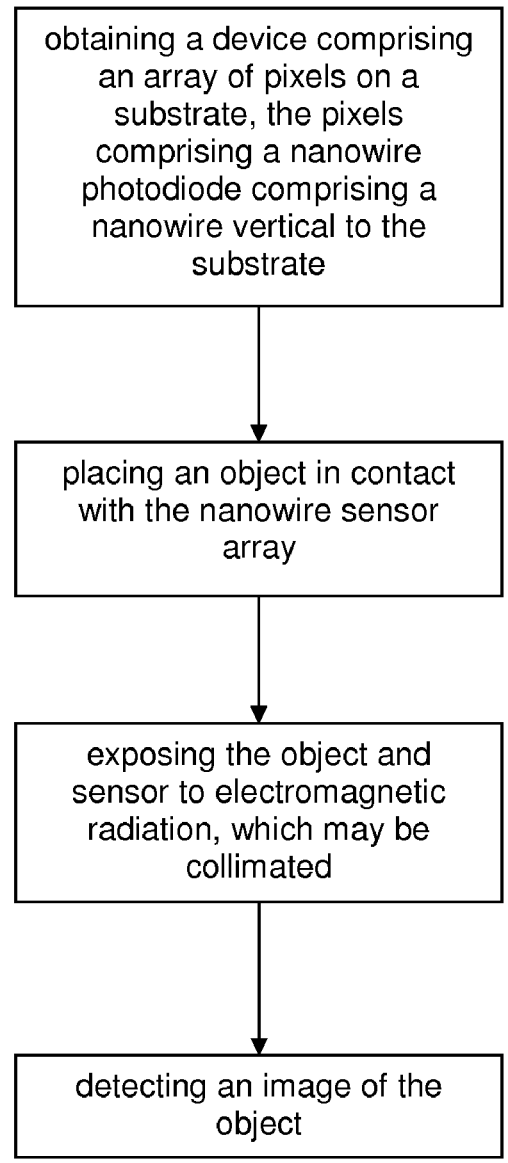
FIG. 15 shows a flow chart of a method according to the an embodiment.

FIG. 13 illustrates an embodiment of a sensor array. FIG. 13 illustrates a penny round pattern where the pixels are arranged as a staggered pattern row by row. Other ways of arranging the pixel array may also be used. Examples include, but are not limited to, hexagonal pattern, Bayer pattern, and semi-regular pattern. Individual nanowire sensors are preferably located at the center of each pixel. By placing the nanowire sensors in a close-packed configuration, a high density array of sensors can be produced.

FIGS. 14a and 14b illustrates an embodiment of a passive pixel which is similar to the embodiment illustrated in FIG. 4, however, in this embodiment the nanowire is surrounded by two or more concentric dielectric layers. In one aspect, the nanowire lacks a concentric metal layer. In another aspect, the nanowire is surrounded by two or more concentric dielectric layers and a concentric metal layer. In this embodiment, the two or more concentric dielectric layers perform the light guiding function performed by the metal in the embodiment illustrated in FIG. 5. Thus, one aspect of this embodiment is the absence of a metal layer.

In another aspect, the successive concentric dielectric layers of the two or more concentric dielectric layers have a lower index of refraction with increasing radius. That is, concentric dielectric layers with a larger radius have a lower index of refraction than concentric dielectric layers having a smaller radius. In another aspect, adjacent concentric dielectric layers have alternating higher and lower indexes of refraction. All references mentioned in the application are incorporated herein in their entirety by reference.

The foregoing detailed description has set forth various embodiments of the devices and/or processes via the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to optical coupling to permit transmission of optical light, for example via an optical pipe or fiber, physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A device comprising:
    an array of pixels on a substrate, the pixels comprising a nanowire photodiode comprising a nanowire on the substrate, wherein the pixels are passive pixels, wherein the nanowire comprises a coaxial junction;
    a photogate around the nanowire; and
    a dielectric material around the nanowire, wherein the dielectric material has a refractive index lower than a refractive index of the nanowire, and the dielectric material forms a capacitor between the photogate and the nanowire.

2. The device of claim 1, wherein the nanowire is configured to separate wavelengths of an electromagnetic radiation beam incident on the pixel at a selective wavelength through the nanowire, wherein the nanowire is configured to be both a channel to transmit the wavelengths up to the selective wavelength and an active element to detect the wavelengths up to the selective wavelength transmitted through the nanowire.

3. The device of claim 2, wherein the selective wavelength comprises ultraviolet light and smaller wavelength light.

4. The device of claim 1, wherein the device is configured to detect objects of approximately 500 nm or less in size.

5. The device of claim 4, wherein the device is configured to detect objects of approximately 100 nm or less in size.

6. The device of claim 1, wherein the nanowire comprises silicon.

7. The device of claim 1, wherein spacing between nanowires is filled with $SiO_2$.

8. The device of claim 1, wherein spacing between nanowires is filled with air.

9. The device of claim 1, wherein the array of pixels are arranged in a penny round pattern.

10. The device of claim 1, wherein the array of pixels are arranged in a Bayer pattern.

11. The device of claim 1, wherein the coaxial junction is a coaxial p-i-n junction.

12. The device of claim 1, wherein the nanowire photodiode comprises a peripheral circuit element.

13. The device claim 12, wherein the pixels comprise a vertical p-i-n nanowire structure.

14. The device of claim 13, wherein the vertical p-i-n nanowire structure comprises an intrinsic nanowire core, a p+ layer at the top of the intrinsic nanowire core and an n− region in the substrate below the intrinsic nanowire core.

15. The device of claim 14, wherein the pixels are configured so that a negative bias applied to the pixel depletes the nanowire of charges and generates a potential gradient in the nanowire that sweeps the charges to the substrate.

16. The device of claim 14, wherein the nanowire is further coated with a material configured to guide light down the nanowire and reduce optical crosstalk between pixels.

17. The device of claim 13, wherein the vertical p-i-n nanowire structure comprises an n− core surrounded with an intrinsic layer, the intrinsic layer surrounded by an p+ layer.

18. The device of claim 17, wherein the pixels are configured so that the substrate is at electrical ground and a negative bias applied to the pixels allows the nanowire and the substrate to be depleted of mobile charges.

19. The device of claim 18, wherein the nanowire is configured with two electric filed components, one electric field component directed toward a center of the nanowire and the other directed toward the substrate.

20. The device of claim 19, wherein charges in the nanowire move toward the center of the nanowire and then toward the substrate.

21. The device of claim 1, further comprising an optical imaging system.

22. The device of claim 1, wherein the nanowire is surrounded by two or more concentric dielectric layers.

23. The device of claim 22, wherein the nanowire lacks a concentric metal layer.

24. The device of claim 22, wherein successive concentric dielectric layers of the two or more concentric dielectric layers have a lower index of refraction with increasing radius.

25. The device of claim 22, wherein concentric dielectric layers having a larger radius have a lower index of refraction than concentric dielectric layers having a smaller radius.

26. The device of claim 22, wherein adjacent concentric dielectric layers have alternating higher and lower index of refraction.

27. The device of claim 1, wherein the nanowire is vertical to the substrate.

28. A device comprising a passive pixel sensor comprising:
an array of pixels on a substrate, the pixels comprising a nanowire photodiode comprising a nanowire on the substrate, wherein the pixels are passive pixels, wherein the nanowire comprises a coaxial junction;
a photogate around the nanowire; and
a dielectric material around the nanowire, wherein the dielectric material has a refractive index lower than a refractive index of the nanowire, and the dielectric material forms a capacitor between the photogate and the nanowire.

29. The device of claim 28, further comprising a switch, the switch configured to allow photo-generated charges in the nanowire to accumulate when off and to drain from the nanowire when on.

30. The device of claim 29, wherein the switch comprises a transfer gate, the array of pixels comprises rows and columns, and each transfer gate in a row is connected to a single bus line driven by a vertical driver.

31. The device of claim 28, wherein the array of pixels comprises rows and columns and each pixel has an output connected to a column signal bus.

32. The device of claim 31, wherein the signal bus is connect to an input of an amplifier.

33. The device of claim 32, wherein the array of pixels is configured to read out row by row.

34. The device of claim 28, wherein the nanowire is configured to separate wavelengths of an electromagnetic radiation beam incident on the pixel at a selective wavelength through the nanowire, wherein the nanowire is configured to be both a channel to transmit the wavelengths up to the selective wavelength and a photosensitive element to detect the wavelengths up to the selective wavelength transmitted through the nanowire.

35. The device of claim 34, wherein the substrate further comprises a photodiode therein.

36. The device of claim 35, wherein the photodiode in the substrate is configured to absorb photons at wavelengths longer than the selective wavelength.

37. The device of claim 28, wherein the photogate is configured to control the potential in the nanowire, forming a potential gradient in the vertical and horizontal directions.

38. The device of claim 28, wherein each pixel comprises a shallow trench isolation region configured to electrically isolate the pixels from each other.

39. The device of claim 28, wherein each pixel further comprises an indium tin oxide (ITO) layer and wherein a bias voltage is applied to the pixels through the ITO layer.

40. The device of claim 28, wherein each pixel comprises a switch placed on the nanowire photodiode.

41. The device of claim 40, wherein the array of pixels is configured in rows and columns and the substrate comprises an n+ layer configured to connect nanowires in a column.

42. The device of claim 41, wherein the n+ layer in the substrate is configured as a signal bus line.

43. The device of claim 40, wherein the pixels are configured such that when the switch is off, a potential barrier is formed underneath the switch, allowing photo-generated charges in the nanowire to accumulate.

44. The device of claim 43, wherein the nanowire is electrically isolated from the substrate but not optically isolated from the substrate.

45. The device of claim 40, wherein when the switch is turned on, charges in the nanowire flow into the substrate.

46. The device of claim 28, wherein the pixels comprise a vertical p-i-n nanowire structure and a nanowire switch.

47. The device of claim 46, wherein the vertical p-i-n nanowire structure comprises an intrinsic nanowire core, a p+ layer at the top of the intrinsic nanowire core and an n+ region in the substrate below the nanowire, the substrate having p− doping.

48. The device of claim 47, wherein the nanowire comprises an n− layer between the switch and the intrinsic nanowire core.

49. The device of claim 47, wherein the n+ region has a substantially annular shape with a hole, the hole configured to provide an electrical path from the intrinsic nanowire to the p− doped substrate.

50. The device of claim 46, wherein the vertical p-i-n nanowire structure comprises an n− core surrounded with an intrinsic layer, the intrinsic layer surrounded by an p+ layer.

51. The device of claim 46, wherein the vertical p-i-n nanowire structure comprises an intrinsic nanowire core, a p+ layer at the top of the intrinsic nanowire core and an n+ region in below the nanowire, wherein the n+ region is on a metal strip on an insulating layer on the substrate.

52. The device of claim 51, wherein the n+ region has an ohmic contact with the metal strip.

53. The device of claim 51, wherein the substrate comprises silicon, a III-V semiconductor, and II-VI semiconductor, or plastic.

54. The device of claim 51, wherein the substrate does not comprise a photodiode therein.

55. The device of claim 46, wherein the vertical p-i-n nanowire structure comprises an n− core surrounded with an intrinsic layer, the intrinsic layer surrounded by an p+ layer, the vertical p-i-n structure further comprising an n+ region in below the nanowire, wherein the n+ region is on a metal strip on an insulating layer on the substrate.

56. The device of claim 55, wherein the substrate comprises silicon, a III-V semiconductor, and II-VI semiconductor, or plastic.

57. The device of claim 28, wherein the nanowire is vertical to the substrate.

58. A method of imaging comprising:
   obtaining a device comprising an array of pixels on a substrate, the pixels comprising a nanowire photodiode comprising a nanowire on the substrate;
   placing an object in contact with the nanowire sensor array;
   exposing the object and sensor to electromagnetic radiation; and
   detecting an image of the object,
   wherein the pixels are passive pixels, wherein the nanowire comprises a coaxial junction, a photogate around the nanowire; and
   a dielectric material around the nanowire, wherein the dielectric material has a refractive index lower than a refractive index of the nanowire, and the dielectric material forms a capacitor between the photogate and the nanowire.

59. The device of claim 58, wherein the nanowire sensor is configured to detect objects of approximately 500 nm or less in size.

60. The method of claim 58, wherein the electromagnetic radiation is collimated.

61. The method of claim 58, wherein the pixels are arranged in a penny round pattern.

62. The method of claim 58, wherein the array is of pixels comprises rows and columns and the array is read row by row.

63. The method of claim 58, wherein charges generated in the pixels are amplified outside of the pixel array.

64. The method of claim 58, wherein the nanowire is vertical to the substrate.

* * * * *